(12) United States Patent
Tsach

(10) Patent No.: US 11,060,205 B2
(45) Date of Patent: Jul. 13, 2021

(54) DIAMOND MATERIALS COMPRISING MULTIPLE CVD GROWN, SMALL GRAIN DIAMONDS, IN A SINGLE CRYSTAL DIAMOND MATRIX

(71) Applicant: M7D Corporation, Beltsville, MD (US)

(72) Inventor: Yarden Tsach, Rockville, MD (US)

(73) Assignee: M7D Corporation, Beltsville, MD (US)

(*) Notice: Subject to any disclaimer, the term of this patent is extended or adjusted under 35 U.S.C. 154(b) by 75 days.

(21) Appl. No.: 16/519,566

(22) Filed: Jul. 23, 2019

(65) Prior Publication Data

US 2019/0345632 A1     Nov. 14, 2019

Related U.S. Application Data

(63) Continuation of application No. 16/406,417, filed on May 8, 2019, now Pat. No. 10,822,719.

(60) Provisional application No. 62/668,410, filed on May 8, 2018.

(51) Int. Cl.
  *C30B 25/20*     (2006.01)
  *C30B 29/04*     (2006.01)
  *C30B 25/18*     (2006.01)

(52) U.S. Cl.
  CPC ............ *C30B 29/04* (2013.01); *C30B 25/183* (2013.01); *C30B 25/20* (2013.01)

(58) Field of Classification Search
  CPC ........ C30B 29/04; C30B 25/20; C30B 25/183
  See application file for complete search history.

(56) References Cited

U.S. PATENT DOCUMENTS

| | | | |
|---|---|---|---|
| 5,861,707 A | 1/1999 | Kumar | |
| 6,554,673 B2 | 4/2003 | Pehrsson et al. | |
| 2004/0258918 A1 | 12/2004 | Chaffin | |
| 2005/0202665 A1 | 9/2005 | Namba et al. | |
| 2009/0324810 A1* | 12/2009 | Serikawa | C23C 16/271 427/78 |
| 2010/0123098 A1 | 5/2010 | Hemley et al. | |
| 2012/0047950 A1 | 3/2012 | Grotjohn et al. | |
| 2014/0061510 A1 | 3/2014 | Twitchen et al. | |
| 2014/0319538 A1* | 10/2014 | Takenaka | G01L 1/18 257/77 |
| 2016/0201221 A1 | 7/2016 | Misra et al. | |

OTHER PUBLICATIONS

International Search Report and Written Opinion issued in International Application No. PCT/IB2019/53790 dated Sep. 16, 2019.

* cited by examiner

*Primary Examiner* — Robert M Kunemund
(74) *Attorney, Agent, or Firm* — Womble Bond Dickinson (US) LLP

(57) ABSTRACT

The present technology relates to diamond materials and structures created using chemical vapor deposition techniques (i.e., creation of synthetic diamond). The chemical vapor deposited diamond includes a multiphase material comprising (a) a single crystalline matrix phase and (b) plurality of diamond grains, each of the plurality of diamond grains being crystallographically distinct from the single crystalline matrix phase.

12 Claims, 26 Drawing Sheets

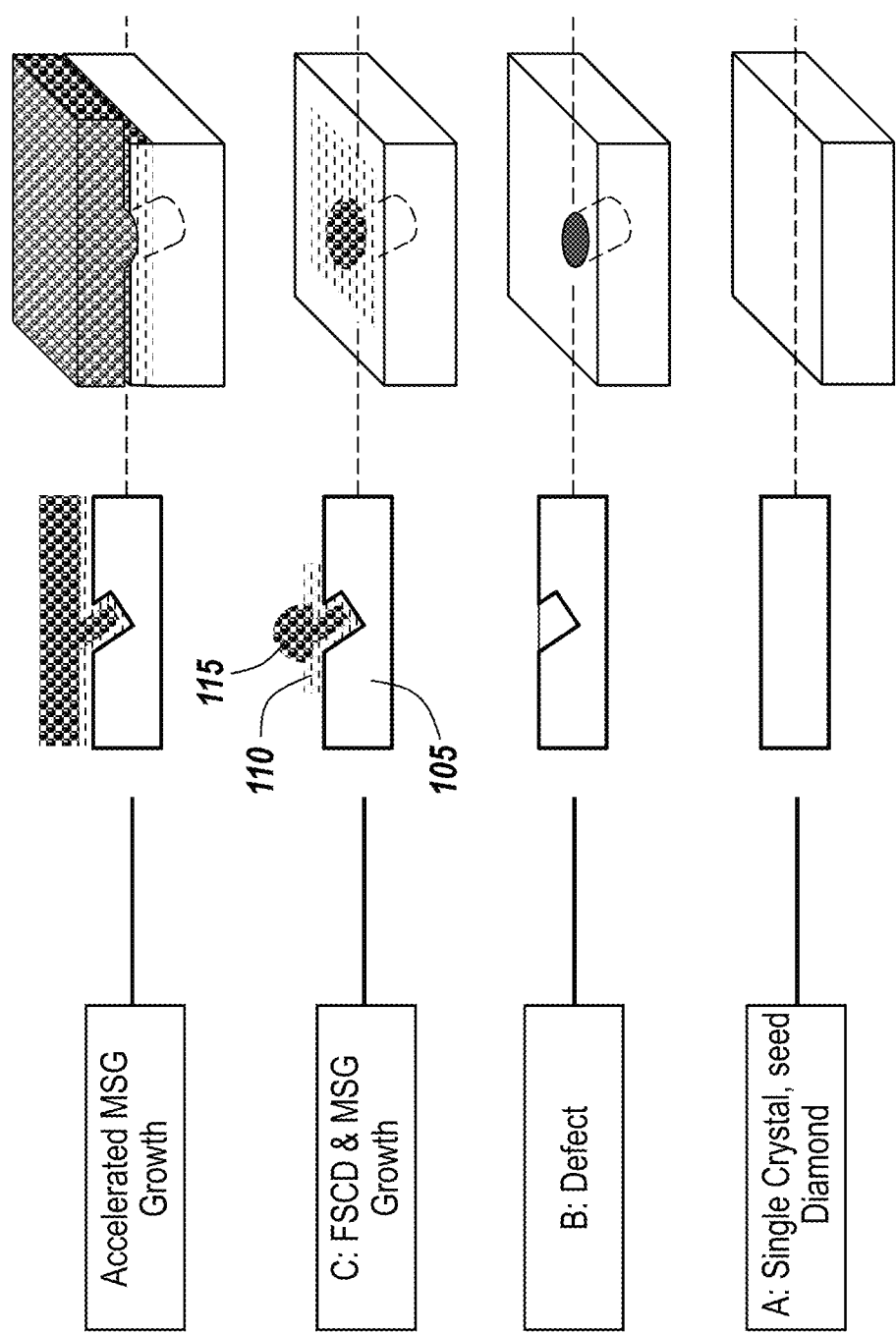

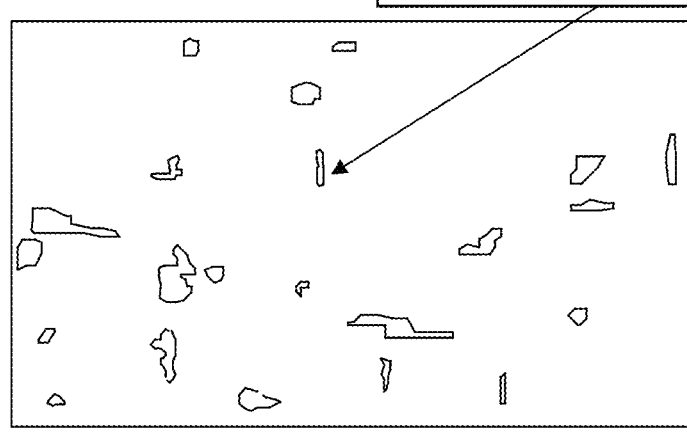
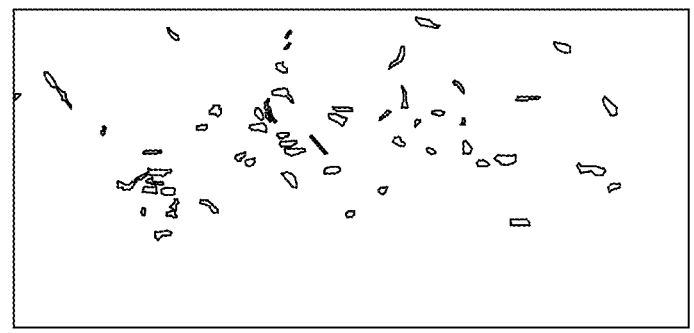
*Fig. 11*

Sharp edge, 0.60 $C_d$

Chamfer lead, 0.90 $C_d$

Radius lead, 0.98 $C_d$

FLOW DIRECTION →

DIAMOND MATERIALS COMPRISING MULTIPLE CVD GROWN, SMALL GRAIN DIAMONDS, IN A SINGLE CRYSTAL DIAMOND MATRIX

1. CROSS-REFERENCE TO RELATED APPLICATIONS

This application is a continuation of U.S. patent application Ser. No. 16/406,417 filed on May 8, 2019 now U.S. Pat. No. 10,822,719 and claims priority to and benefit of U.S. provisional patent application No. 62/668,410 filed on May 8, 2018 entitled "Diamond Matrix Comprising Multiple CVD Grown, Small Grain Diamonds, in a Single Crystal Diamond Matrix", the entire contents of which are incorporated herein by reference in their entireties.

2. FIELD OF THE TECHNOLOGY

The technology relates generally to diamond materials, and in particular, methods of making as well as tailoring the material properties of the diamond material for particular applications. More particularly, the technology relates to making a diamond material using chemical vapor deposition technology to grow both a multiphase diamond material and a synthetic diamond material on a substrate. Growth methods of the technology can be controlled such that the resulting diamond material is tailored according to desired material characteristics. For example, the methods of the technology can be utilized to create a resulting diamond material with encapsulated islands positioned at desired locations within the resulting diamond structure.

3. BACKGROUND

The material properties of diamond are advantageous for a number of commercial and industrial applications. In addition to being the hardest known material, it has excellent thermal conductivity properties, chemical inertness, high wear resistance, and optical transparency.

In the last few decades, work has progressed in forming synthetic diamonds. In particular, chemical vapor deposition has been studied and used to develop single crystal diamond. Work has been primarily focused on growth rates, reduction of impurities, and color characteristics. One of the primary goals of the above-mentioned work has been to create a single crystal or a consistent phase diamond material.

4. SUMMARY OF THE TECHNOLOGY

In general, the present technology relates to a man-made diamond material. In embodiments, the diamond material of the present technology includes a synthetic single crystal diamond, (SCD or SC) that function as a matrix for multiple small grain (MSG) diamonds. The diamond material of the present technology is grown by chemical vapor deposition (CVD) on a substrate, such as, for example, a single crystal diamond substrate.

Multiple small grain (MSG) diamonds are a collection or plurality of diamond grains that have a crystallographic orientation that is distinct from the single crystal diamond substrate and/or single crystal matrix material. As the crystallographic orientation of the CVD grown (e.g., synthetic) single crystal diamond matrix is distinct from the MSG diamond, the resulting material is multiphase, wherein a first phase is single crystalline and a second phase includes the MSG diamonds.

In the case of growing a SCD, the process starts with a single crystal seed diamond, whose surface that is facing the plasma, has limited quantity of defects restricted also by type and size. As the CVD process progresses a SC is grown on the seed diamond. The newly created layers of synthetic SC are identical to those of the seed diamond.

In the case of growing multiple small grain diamonds, the process starts with a single crystal seed diamond, having defects on its surface that is facing the plasma. In some cases, the defects, such as faults, are intentionally formed in a controlled manner, in-order to facilitate the growth of multiple small grain diamonds. Defects can be formed by manipulating the CVD process parameters, such as a reduction of N2, reduction of etchant, elevation of surface temperature or decreasing the distance between the growth surface and the center of the plasma. By manipulating the CVD process parameters, the density and size of the multiple small grain diamonds can be controlled. In some cases, the defect, such as a fault, can be created at desired locations by means of a mask that is applied on the single crystal seed diamond.

In some cases, the defects appear as an artifact of the growth process that has deviated slightly from SCD optimal conditions into MSG diamonds conditions. As the CVD process progresses, a layer with a high concentration of stacking faults and dislocations develops in the vicinity of the defects. As the CVD process further progresses grain boundaries start forming and crystallites form above the grain boundaries. Further growth of these crystallites form the multiple small grain diamonds layer.

Described below are two types of structures of CVD grown single crystal diamonds and multiple small grain diamonds within a SCD. The first is a 'laminate structure' including a MSG diamond layer that is grown from a single crystal diamond substrate. The MSG diamond layer facing towards the CVD plasma. The second is an 'encapsulation structure', in which MSG diamond regions are surrounded by a single crystal diamond. That is, a single crystal diamond encapsulates MSG diamond regions, either partially (at least two surfaces, e.g., radially) or completely (at least three surfaces, e.g., includes a capping region on/above the MSG diamonds).

Both structures are grown from a seed diamond. The seed diamond is a SCD. There is no external binder or binding material.

In an embodiment, the resulting diamond material contains less than 20, 50, 100, 200, 400, 700, 1000 PPM of metal elements.

In general, the present technology relates to a man-made diamond material. In one aspect the technology is directed to a diamond material (e.g., synthetic diamond material). The diamond material including a single crystal diamond substrate (e.g., the substrate can be natural or man-made) including at least one purposely created defect at least partially located on an exterior surface of the single crystal substrate. The at least one purposely created defect is defined by a surface that has a different lattice orientation as the single crystal diamond substrate. The diamond material also includes a CVD grown diamond portion tangent to the at least one purposely created defect and the CVD grown diamond portion includes a first phase including a plurality of diamond grains which are distinct from the single crystal diamond substrate and a second phase forming a matrix for the first phase and consisting of single crystal diamond having the same lattice orientation as the single crystal diamond substrate. In certain embodiments, a CVD grown diamond layer includes a high fault density (i.e., a diamond material grown by CVD that can be characterized as including a large number of faults, e.g., at least about $10^5$ faults/$cm^2$ within a surface area; at least about $10^6$ faults/$cm^2$ within a surface area) can be located (i.e., deposited) between the at least one purposely created defect in the substrate and the CVD grown diamond portion.

An aspect of the technology is directed to a diamond material. The diamond material including a single crystal diamond substrate, a CVD grown diamond layer including a plurality of faults; and a CVD grown diamond portion in contact with the CVD grown diamond layer; the CVD grown diamond portion comprising a first phase including a plurality of diamond grains which are distinct from the single crystal diamond substrate and a second phase forming a matrix for the first phase and consisting of single crystal diamond having the same lattice orientation as the single crystal diamond substrate.

Another aspect of the technology is directed to a diamond material including portions of single crystalline diamond; and a multiphase material. The multiphase material includes a first phase including a plurality of diamond grains, each of the plurality of diamond grains being crystallographically distinct from the portions of single crystalline diamond and a second phase forming a matrix for the first phase. The second phase consists of CVD grown single crystalline diamond, wherein one or more regions of multiphase material are at least partially encapsulated by CVD grown single crystalline diamond.

An aspect of the technology is directed to a method of tailoring a diamond material structure. The method includes positioning a single crystal diamond substrate in a CVD reactor; setting CVD reactor conditions to a first setting to promote growth of one of (i) single crystalline diamond material or (ii) multiphase material comprising a first phase including a plurality of diamond grains which are distinct from the single crystal diamond substrate and a second phase forming a matrix for the first phase and consisting of single crystal diamond having the same lattice orientation as the single crystal diamond substrate; and after CVD growth at the first setting, altering CVD reactor conditions to a second setting different than the first setting to promote growth of the other of (i) single crystalline diamond material or (ii) multiphase material comprising a first phase including a plurality of diamond grains which are distinct from the single crystal diamond substrate and a second phase forming a matrix for the first phase and consisting of single crystal diamond having the same lattice orientation as the single crystal diamond substrate.

An aspect of the technology is directed to a method of CVD manufacturing a diamond structure. The method includes positioning a single crystal diamond substrate in a CVD reactor; and depositing CVD diamond material on the substrate, the CVD diamond material including a plurality of portions consisting of (i) single crystalline diamond having the same crystal lattice orientation as the substrate, (ii) multiphase material comprising a first phase including a plurality of diamond grains which are distinct from the single crystal diamond substrate and a second phase forming a matrix for the first phase and consisting of single crystal diamond having the same lattice orientation as the single crystal diamond substrate, or (iii) a diamond layer characterized by a plurality of faults; wherein the resulting diamond structure includes at least one portion consisting of (i) (i.e., single crystalline diamond having the same crystal lattice orientation as the substrate) and at least one portion consisting of (ii) (i.e., multiphase material comprising a first phase including a plurality of diamond grains which are distinct from the single crystal diamond substrate and a second phase forming a matrix for the first phase and consisting of single crystal diamond having the same lattice orientation as the single crystal diamond substrate).

The above aspect of the technology can be used in a number of different devices. For example, the diamond structure or resulting diamond material can be used to create a diamond tool, such as a rotating wear tool, or as a cutting insert, such as a core drill bit insert, a milling insert, or a lathe insert. In some embodiments, the diamond structure or resulting diamond material can be used in a water jet orifice. In particular, the diamond material can be used and, in some instances, tailored to provide desired material properties along an inner orifice surface of the water jet orifice. In some embodiments, the diamond structure or resulting diamond material can be used in a wire drawing die. In particular, the die has an entrance area, an exit area and a wire passage segment between the entrance and exit areas. On or more of these locations (i.e., entrance area, exit area, and wire passage segment) can be made from the resulting diamond material and the resulting diamond material can be tailored to provide desired properties in one or more of these locations.

In another aspect, the technology is directed to a diamond material. The diamond material according to this aspect, includes a single crystal diamond substrate having a conditioned exterior surface characterized by a plurality of defects, wherein each defect in the plurality of defects is defined by a surface that has a different lattice orientation than the single crystal diamond substrate; and a CVD grown diamond portion deposited on the conditioned exterior surface of the single crystal diamond substrate; the CVD diamond portion comprising a first phase including a plurality of diamond grains which are distinct from the single crystal diamond substrate and a second phase forming a matrix for the first phase and consisting of single crystal diamond having the same lattice orientation as the single crystal diamond substrate.

In an aspect, the technology is directed to a method of manufacturing a diamond material. The method includes: positioning a single crystalline diamond substrate in a CVD reactor; conditioning the single crystalline diamond substrate to include one or more defects on an exterior growth surface, wherein each of the one or more defects is defined by a surface that has a different lattice orientation than the single crystal diamond substrate; operating the CVD reactor at a first set of conditions that promotes growth of a multiphase material comprising a first phase including a plurality of diamond grains, each of the plurality of diamond grains being crystallographically distinct from the single crystalline diamond substrate and a second phase forming a matrix for the first phase, the second phase consisting of CVD grown single crystalline diamond, to result in nucleation of one or more islands comprising multiphase material at locations of the one or more defects; operating the CVD reactor at a second set of conditions that promote growth of CVD single crystalline material over growth of the multiphase material; and operating the CVD reactor at a third set of conditions that promote growth of only the CVD single crystalline material to form a capping region on the one or more islands.

In another aspect, the technology is directed to a method of manufacturing a diamond material. The method, according to this aspect, includes: positioning a single crystalline diamond substrate in a CVD reactor; operating the CVD reactor at a first set of conditions that promotes growth of a multiphase material comprising a first phase including a plurality of diamond grains, each of the plurality of diamond grains being crystallographically distinct from the single crystalline diamond substrate and a second phase forming a matrix for the first phase, the second phase consisting of CVD grown single crystalline diamond, to result in nucleation of one or more islands comprising multiphase material at desired locations on a growth surface of the single crystalline diamond substrate; operating the CVD reactor at a second set of conditions that promote growth of CVD single crystalline material over growth of the multiphase material; and operating the CVD reactor at a third set of conditions that promote growth of only the CVD single crystalline material to form a capping region on the one or more islands.

An aspect of the technology is directed to a method of manufacturing a diamond material. The method includes: positioning a single crystalline diamond substrate in a CVD reactor; operating the CVD reactor at a first set of conditions that promotes growth of a multiphase material comprising a first phase including a plurality of diamond grains, each of the plurality of diamond grains being crystallographically distinct from the single crystalline diamond substrate and a second phase forming a matrix for the first phase, the second phase consisting of CVD grown single crystalline diamond, to result in nucleation of one or more islands comprising multiphase material at desired locations on a growth surface of the single crystalline diamond substrate; operating the CVD reactor at a second set of conditions that promote growth of CVD single crystalline material over growth of the multiphase material; and operating the CVD reactor at a third set of conditions that promote growth of only the CVD single crystalline material to surround the one or more islands with CVD single crystalline diamond in a radial direction with respect to the growth surface of the single crystalline diamond substrate.

The above aspects of the technology provide numerous advantages. For example, an advantage of the present technology is the ability to create new diamond structures. For example, the ability to create encapsulated islands or pockets of multiple small grain material within single crystal diamond material. The ability to tailor diamond materials and structures allows for customizable components/tools/devices. In addition, the wear of components can be controlled and or improved. For example, by including multiphase islands or regions (i.e., small grain diamonds within a single crystal diamond matrix) within a diamond structure, wear can be decreased as the multiphase regions interrupt the wear that can occur more readily on a particular singular crystallographic orientation. Additional features and advantages of the technology will be set forth herein and will be apparent to those of ordinary skill in the art.

5. BRIEF DESCRIPTION OF THE DRAWINGS

The technology may be more fully understood from the following description taken in conjunction with the accompanying drawings. The drawings are not necessarily to scale.

FIG. 2 is a schematic illustration of an embodiment of a growth cycle of a man-made diamond material having a laminate structure shown in both a cross-sectional side view (left side) and its corresponding perspective view (right side). The growth cycle includes four steps: (A) provide a single crystal substrate; (B) purposely create at least one defect in the substrate; (C) grow a faulted single crystal diamond (FSCD) layer and transition to multiple small grain diamond (MSG) growth at the location of the defect; and (D) accelerate MSG growth.

Figure 3:
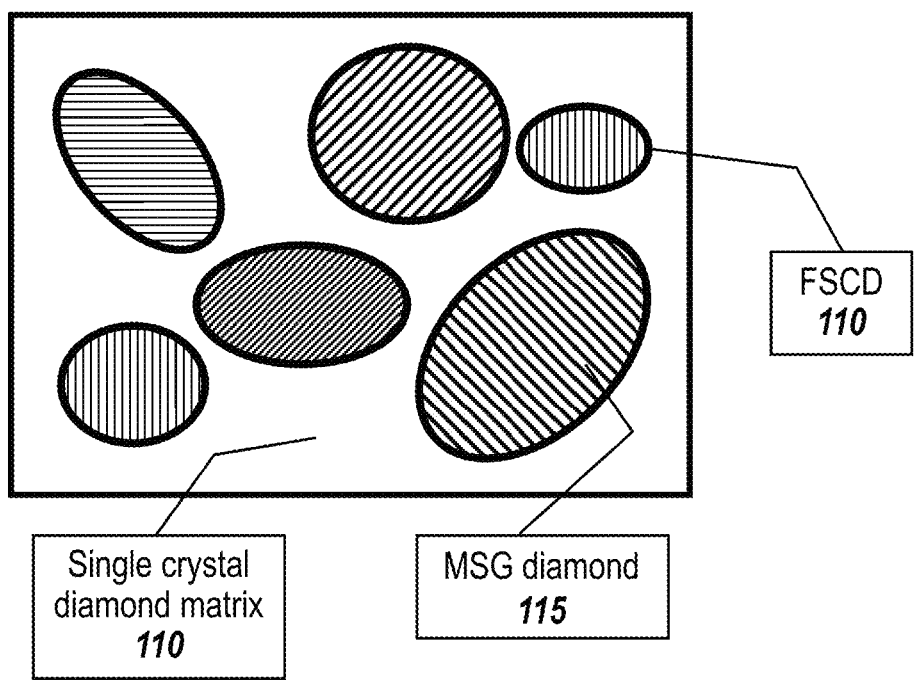

FIG. 3 is a schematic cross-sectional top view illustration of a diamond material in accordance with an embodiment of the present technology. The diamond material includes a single crystal diamond matrix and encapsulated islands of multiple small grains that are non-uniform in both size and orientation. Each of the islands is surrounded by a boundary portion consisting of faulted single crystal diamond. The islands are encapsulated within the matrix material.

Figure 4:
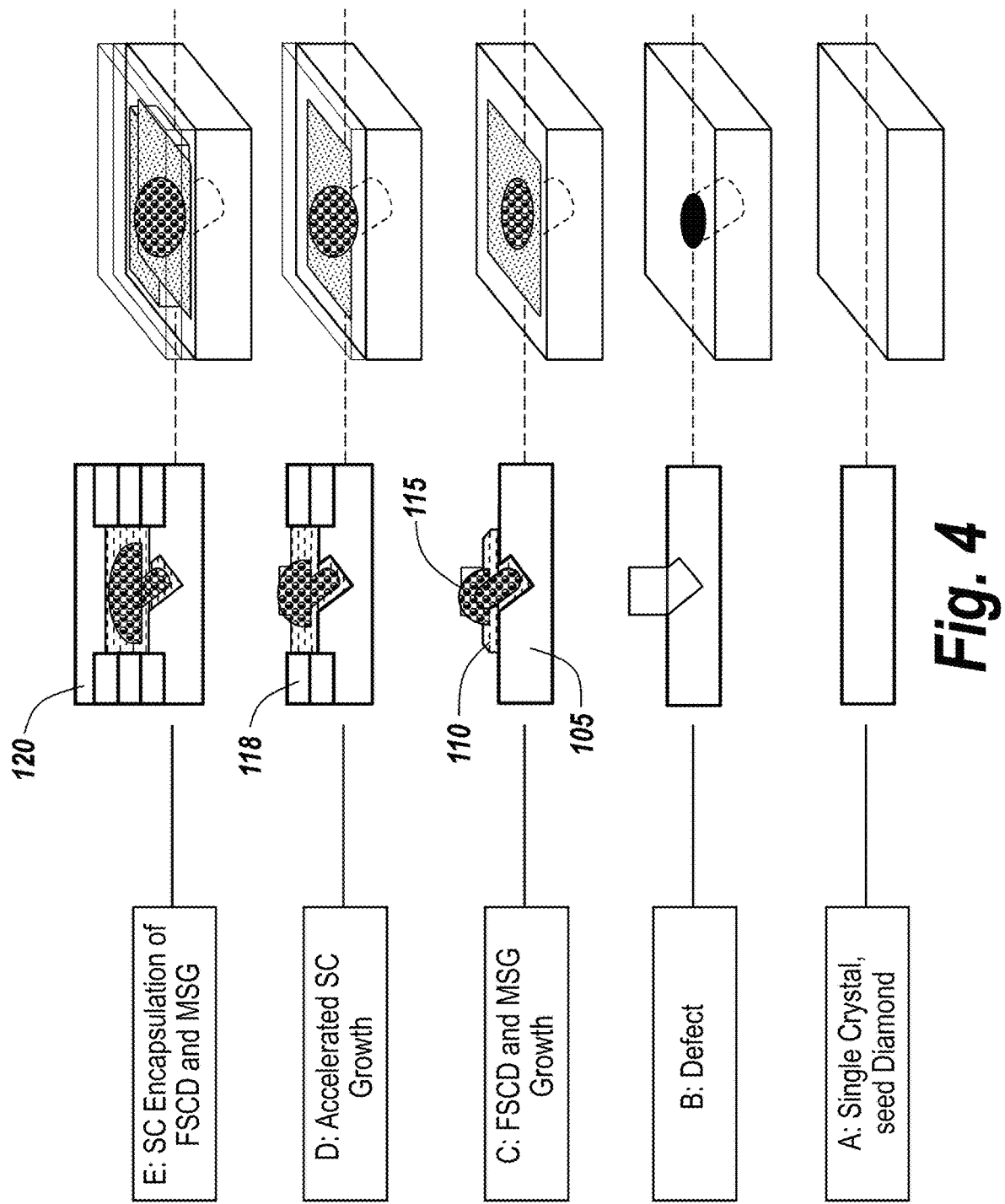

FIG. 4 is a schematic illustration of an embodiment of a growth cycle of man-made diamond material having an encapsulated structure shown in both a cross-sectional side view (left side) and its corresponding perspective view (right side). The growth cycle includes five steps: (A) provide a single crystal substrate; (B) purposely create at least one defect in the substrate; (C) grow a faulted single crystal diamond (FSCD) layer and transition to multiple small grain diamond (MSG) growth at the location of the defect; (D) accelerate single crystal growth to create single crystal matrix material radially about the MSG growth; and (E) fully encapsulate (i.e., grow on top of/cover) the FSCD layer and MSG portion with single crystal material.

Figure 5:
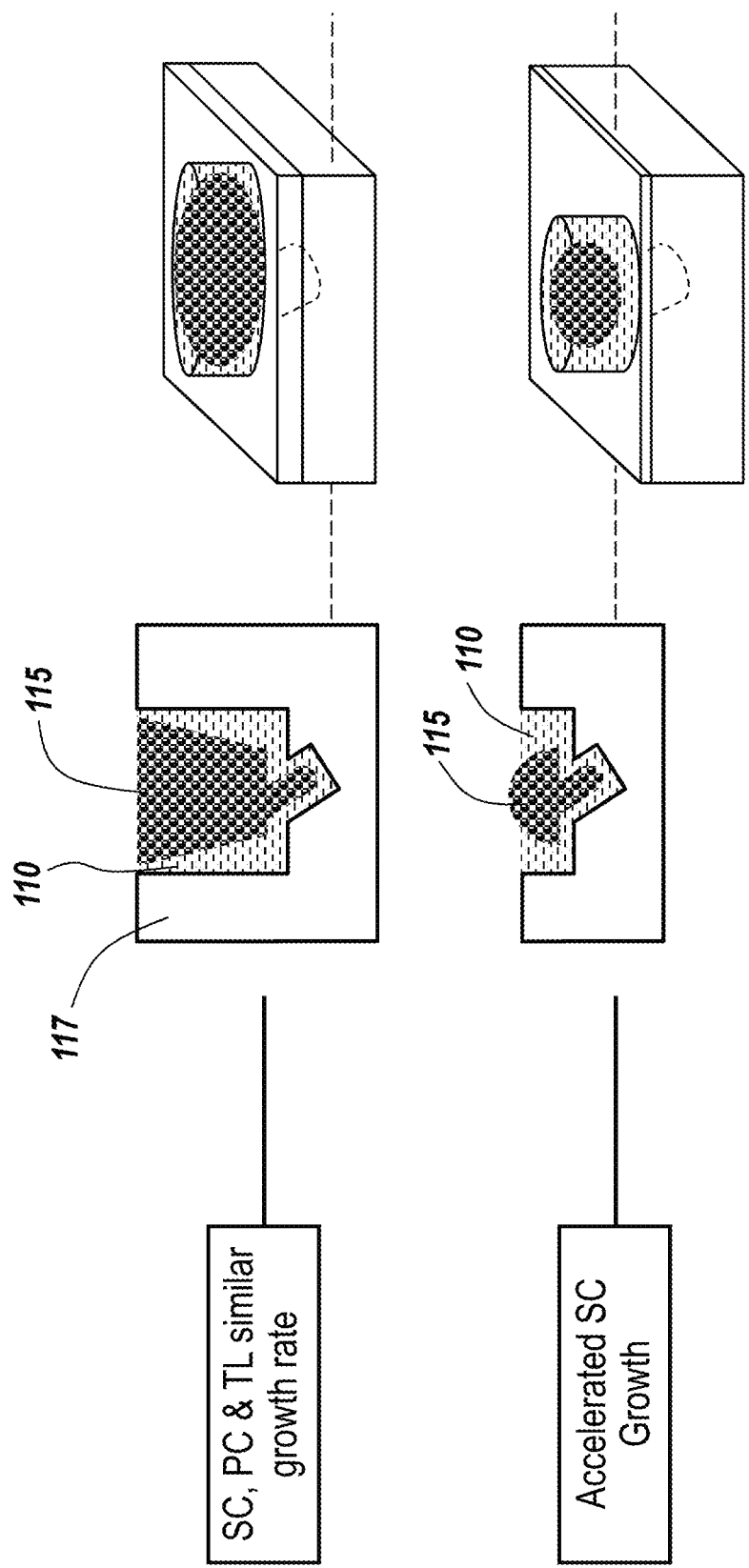

FIG. 5 is a schematic illustration of an alternative embodiment of growth cycle of man-made diamond material. The growth cycle illustrated in FIG. 5 is similar to that of FIG. 4, except instead of creating an encapsulated structure, a partially encapsulated structure is created. That is, step (E) is missing and replaced by further growth of polycrystalline material surrounded by faulted material that is radially encapsulated by single crystalline material.

Figure 6:
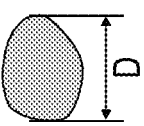

FIG. 6 is a chart providing schematic illustrations of four types of multiple small grain types. FIG. 6 illustrates the top view and a cross-sectional view of each type and also provides comparative information on dimensions.

Figure 7A:
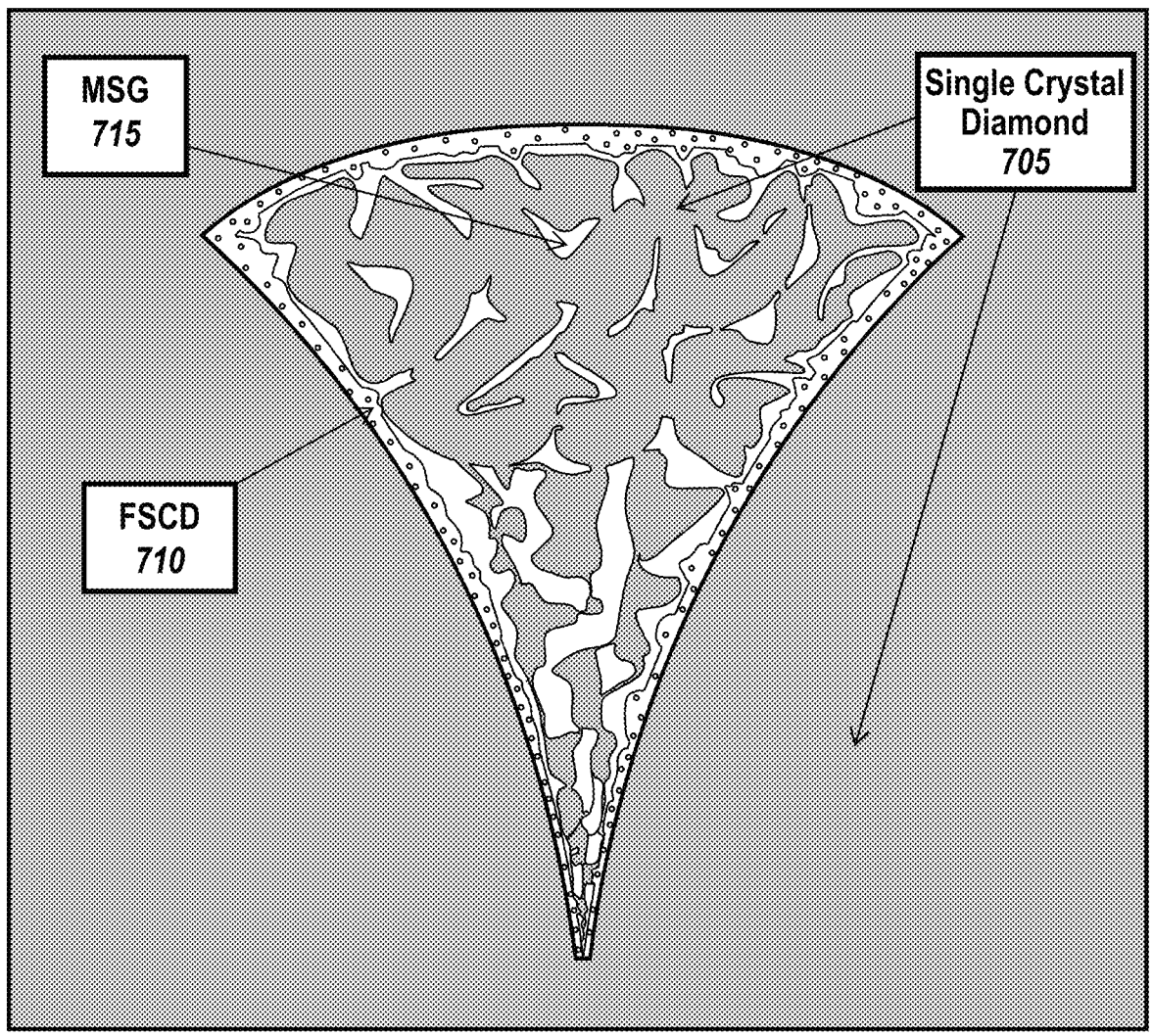

FIG. 7A is a cross-sectional illustration of an island type multiple small grain diamond material bounded by a layer of faulted single crystal diamond material and encapsulated in single crystal material. Note that there is single crystal material within the island, surrounding the pockets of multiple small grains; and there is single crystal diamond material encapsulating the entire island (outside the boundary of the faulted single crystal diamond material).

Figure 7B:
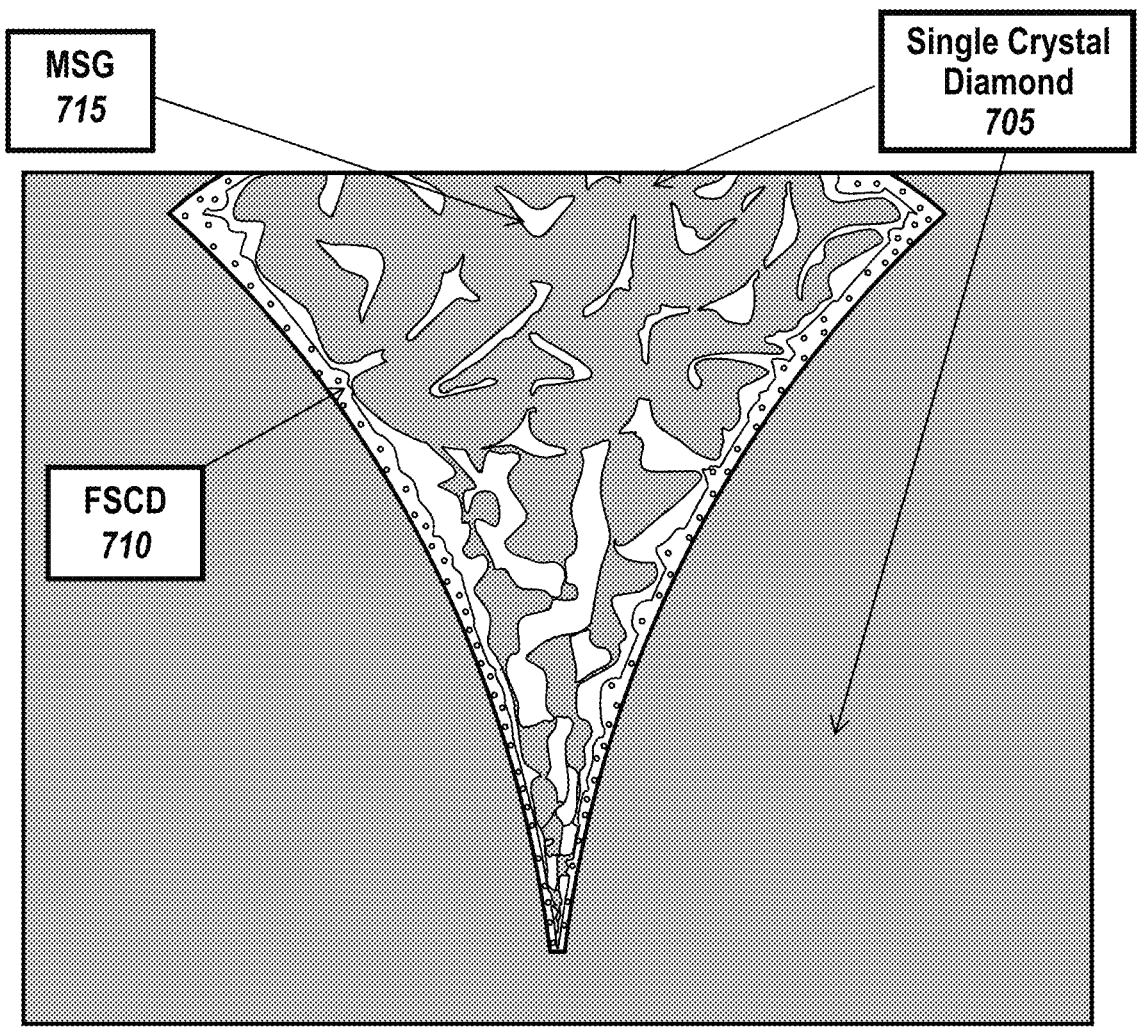

FIG. 7B is a cross-sectional illustration of an island type multiple small grain diamond material bounded in part by a faulted single crystal diamond material and partially encapsulated in single crystal material. The island in FIG. 7B is partially encapsulated in that there is no capping single crystal region (i.e., no single crystal material covering or on top of the island).

Figure 7C:
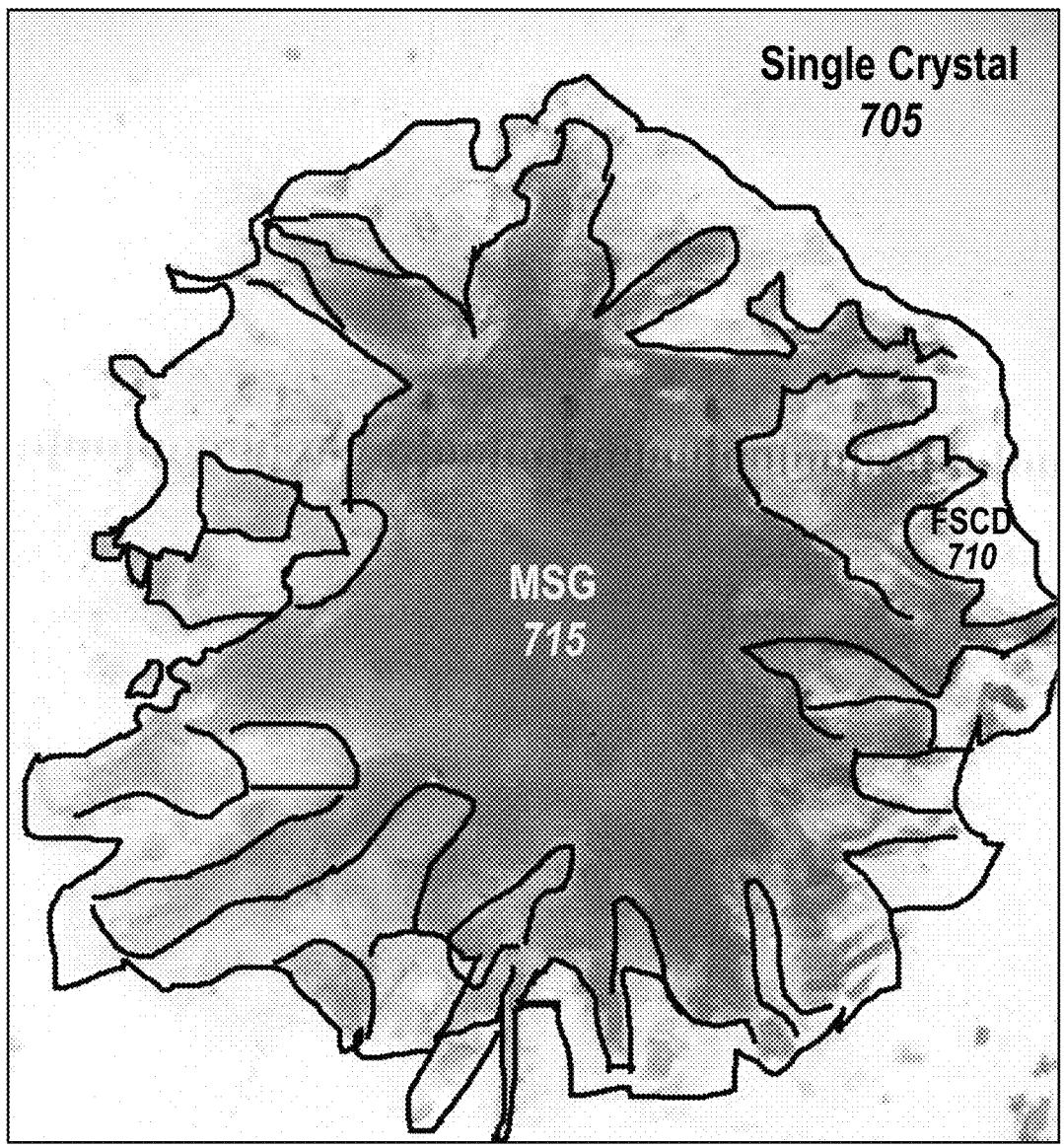

FIG. 7C is a top-view illustration of the partially-encapsulated multiple small grain diamond material shown in FIG. 7B.

Figure 8:
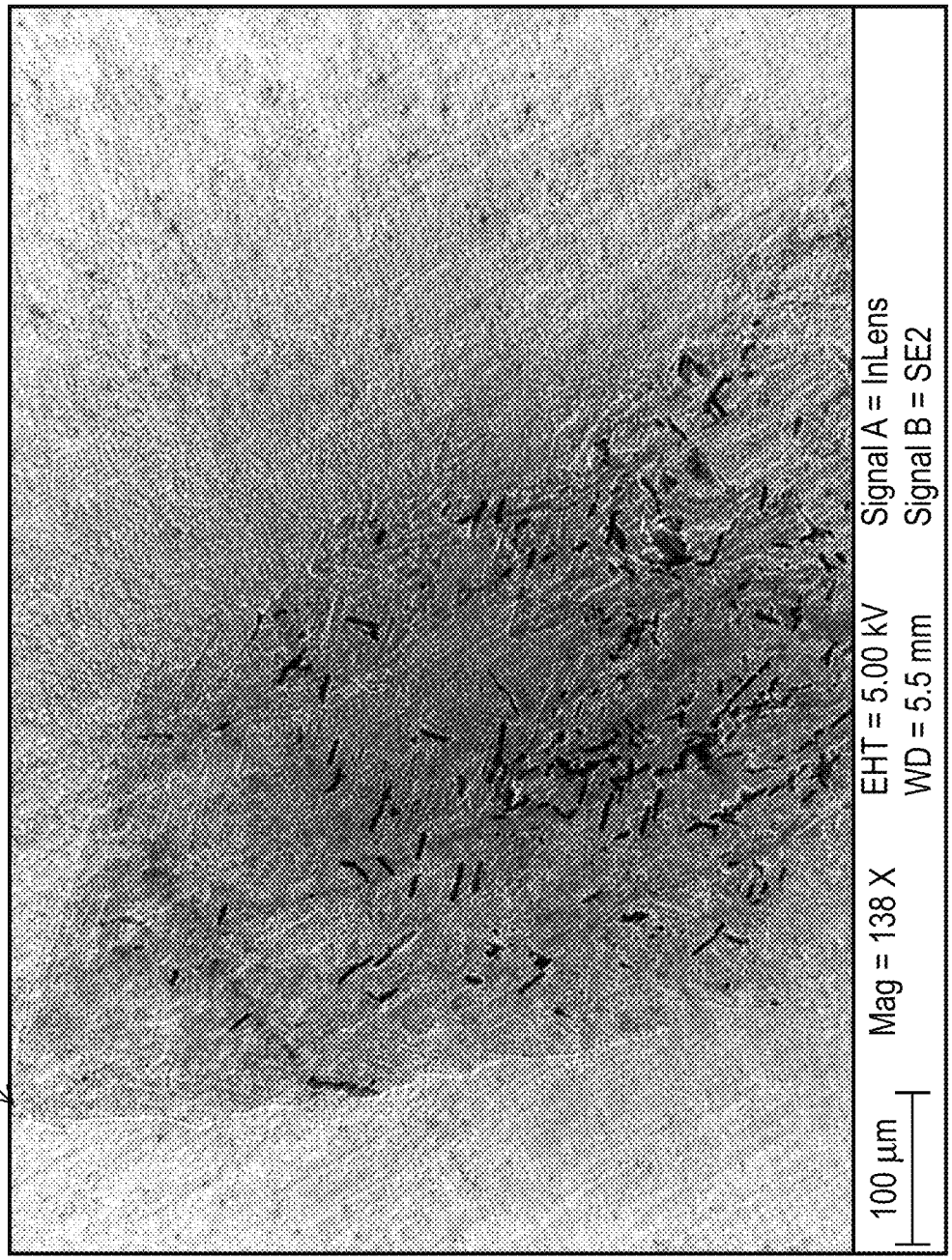

FIG. 8 is a SEM image of an island of multiple small grains taken in cross-section. At the top of the image the tip or the start of island growth is marked.

Figure 9A:
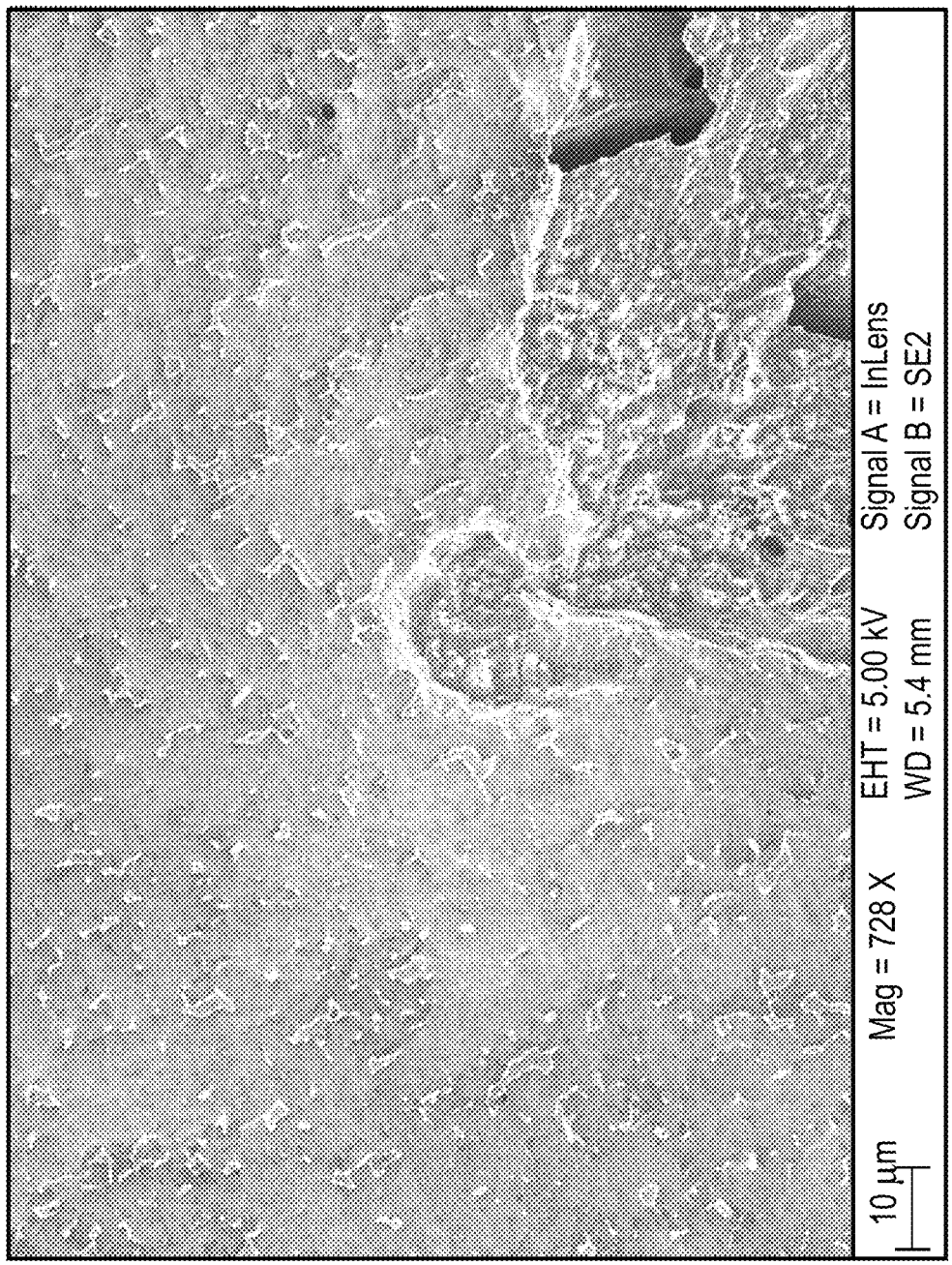

FIG. 9A—is a SEM image of the tip of the island growth shown in FIG. 8, in a magnified view.

Figure 9B:
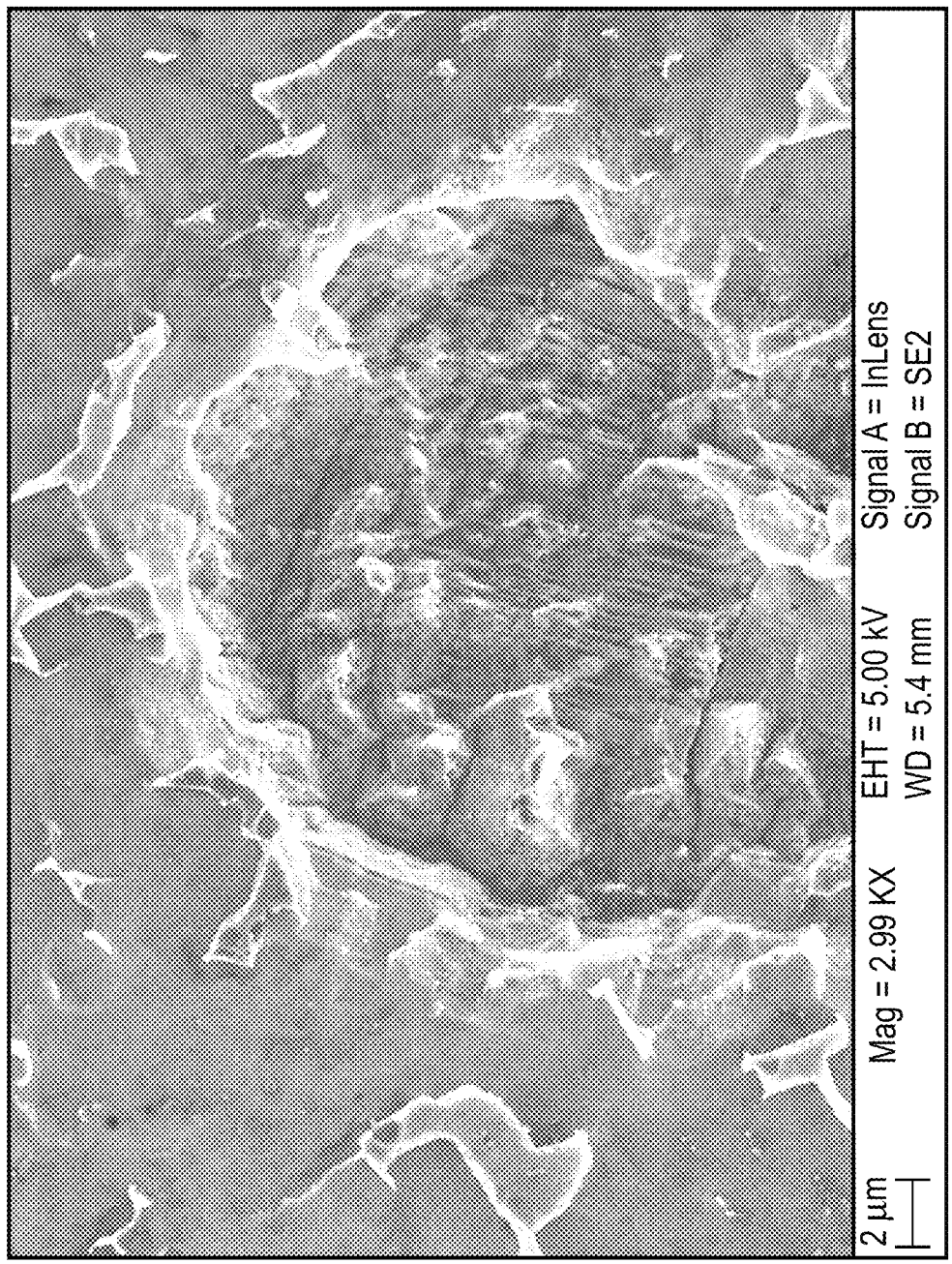

FIG. 9B—is a SEM image of the tip of the island growth shown in FIG. 9A, in a further magnified view. In each of FIGS. 8, 9A, and 9B, the originating grain has been etched away leaving a grain trace and the faulted single crystal shell surrounding it.

Figure 10:
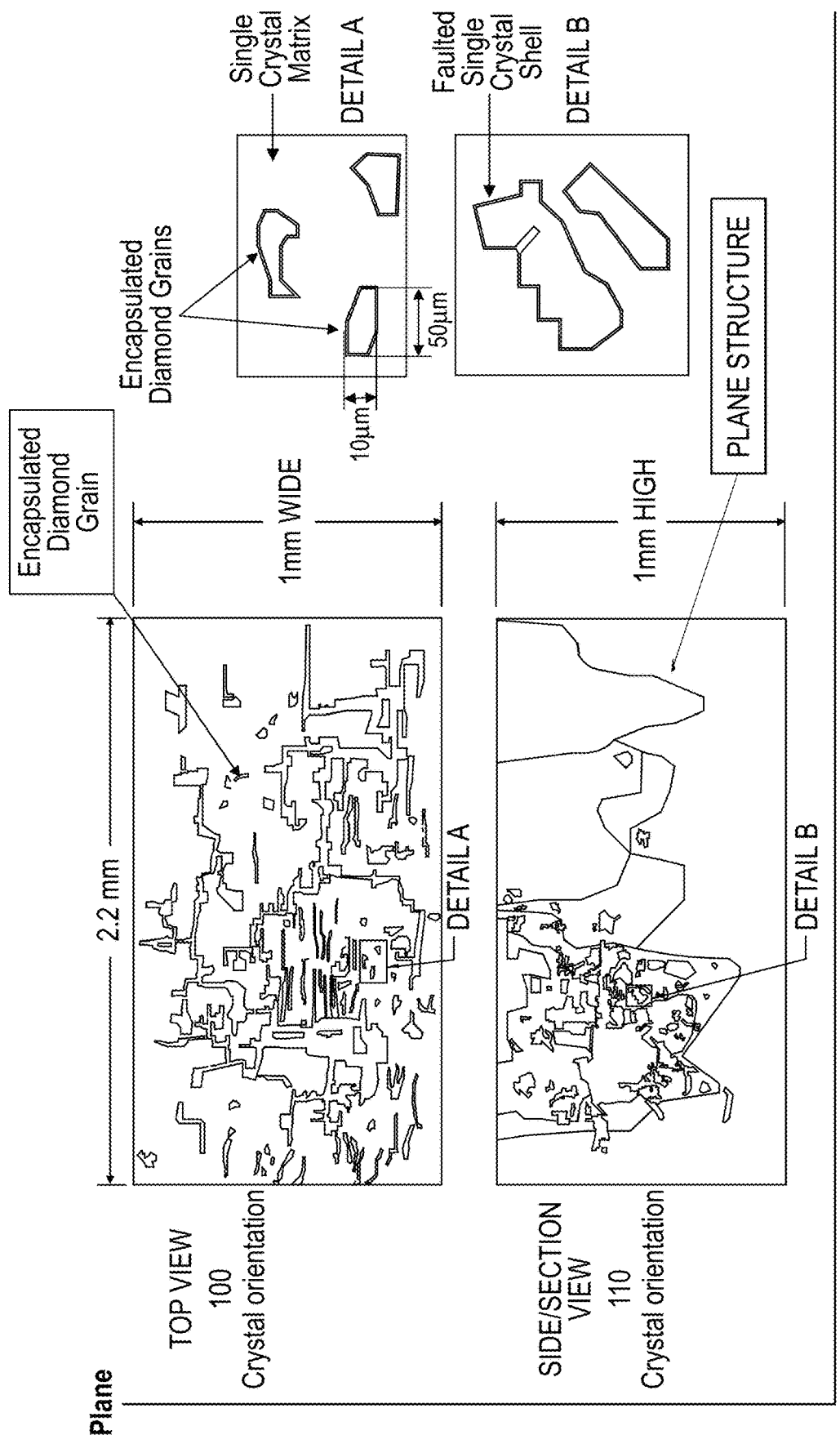

FIG. 10 is a schematic illustration of a plane type multiple small grain diamond structure that is encapsulated in grown single crystal diamond material. FIG. 10 provides both a top cross-sectional view (top, left image) and a side cross-sectional view (bottom, left image). In addition, FIG. 10 provides an expanded view of the structures in detail A of the top cross-sectional view and of detail B in the side cross-sectional view.

FIG. 11 is a schematic illustration of scattered multiple small grains encapsulated in man-made single crystal diamond material in both a top cross-sectional view (top image) and a side cross-sectional view (bottom image). The multiple small grains are scattered throughout the CVD diamond material. In FIG. 10 the multiple small grains grew along a linear pathway to create plane type.

Figure 12A:
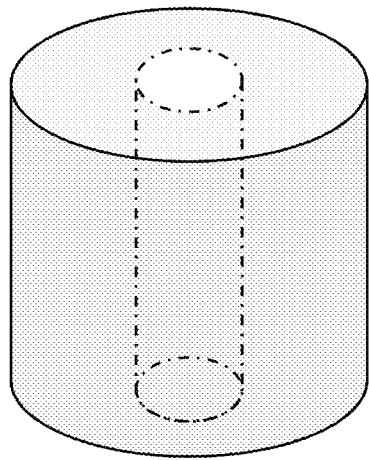
Figure 12B:
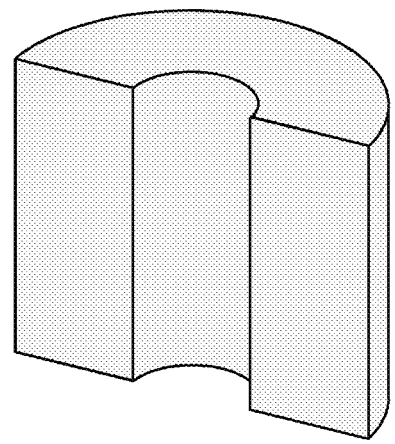

FIG. 12A is a schematic illustration of an embodiment of a diamond tool shown in perspective view. FIG. 12B is a cross-sectional view of the diamond tool shown in FIG. 12A.

Figure 12C:
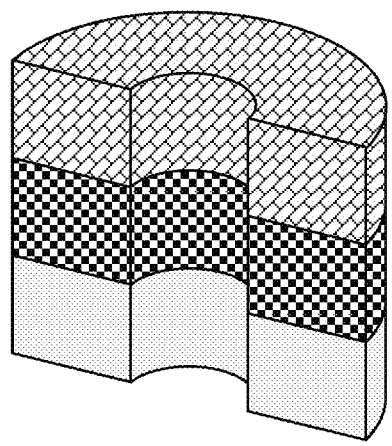

FIG. 12C is a cross-sectional illustration of another embodiment of a diamond tool.

Figure 12D:
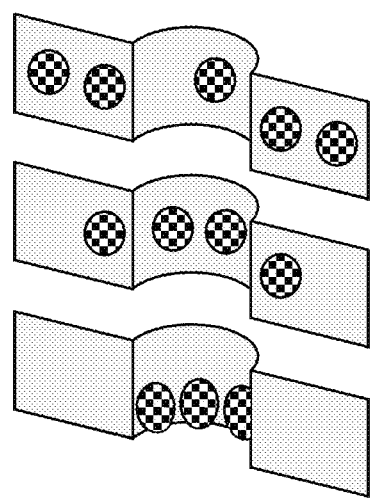

FIG. 12D is a cross-sectional illustration of another embodiment of a diamond tool.

Figure 13:
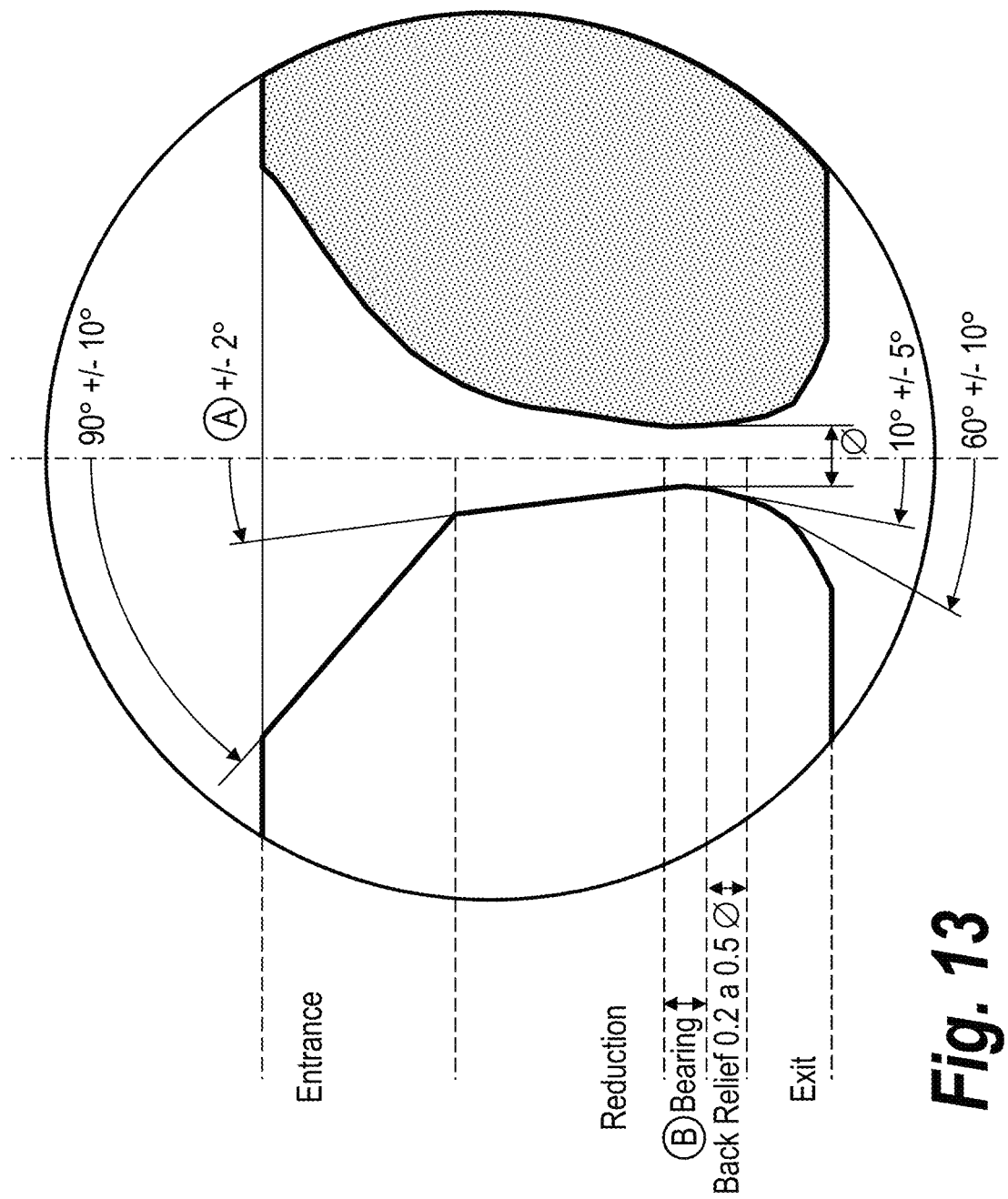

FIG. 13 is an illustration of a conventional wire drawing tool.

Figure 14:
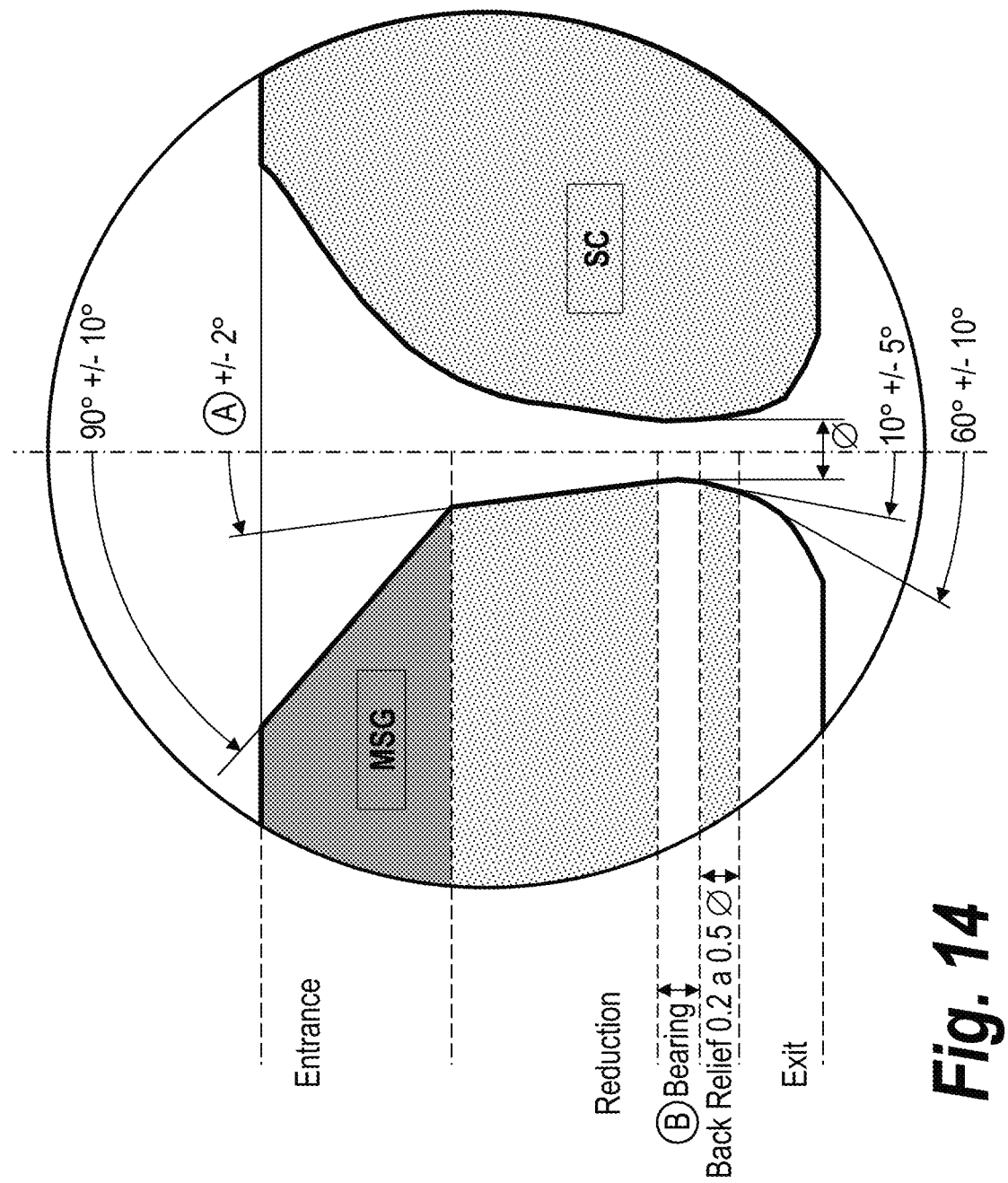
Figure 15A:
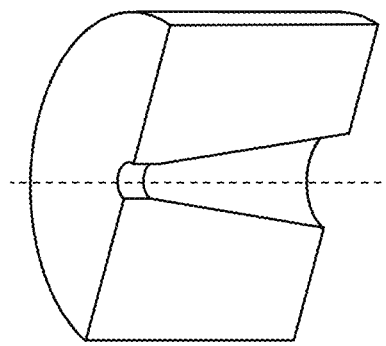
Figure 15B:
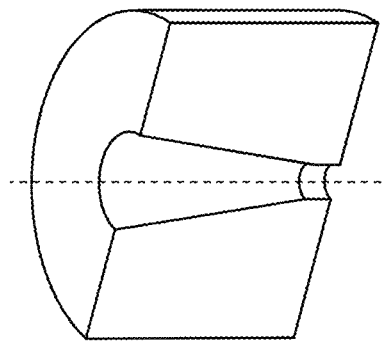
Figure 15C:
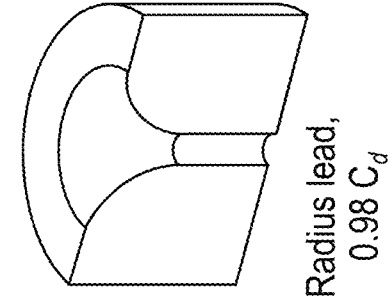
Figure 15D:
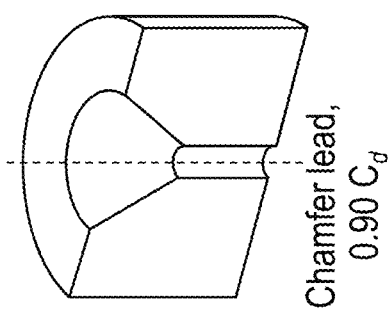
Figure 15E:
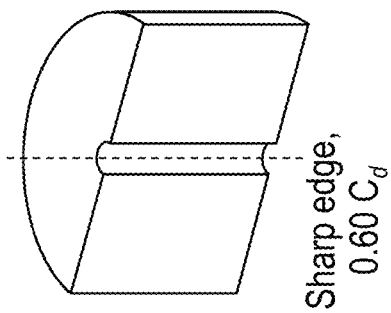

FIG. 14 is an illustration of an embodiment of a wire drawing tool formed to include regions of multiple small grains and synthetic single crystal diamond material.

FIG. 15A, FIG. 15B, FIG. 15C, FIG. 15D and FIG. 15E each illustrate representative embodiments of entrance segments for water cutting tools.

Figure 16A:
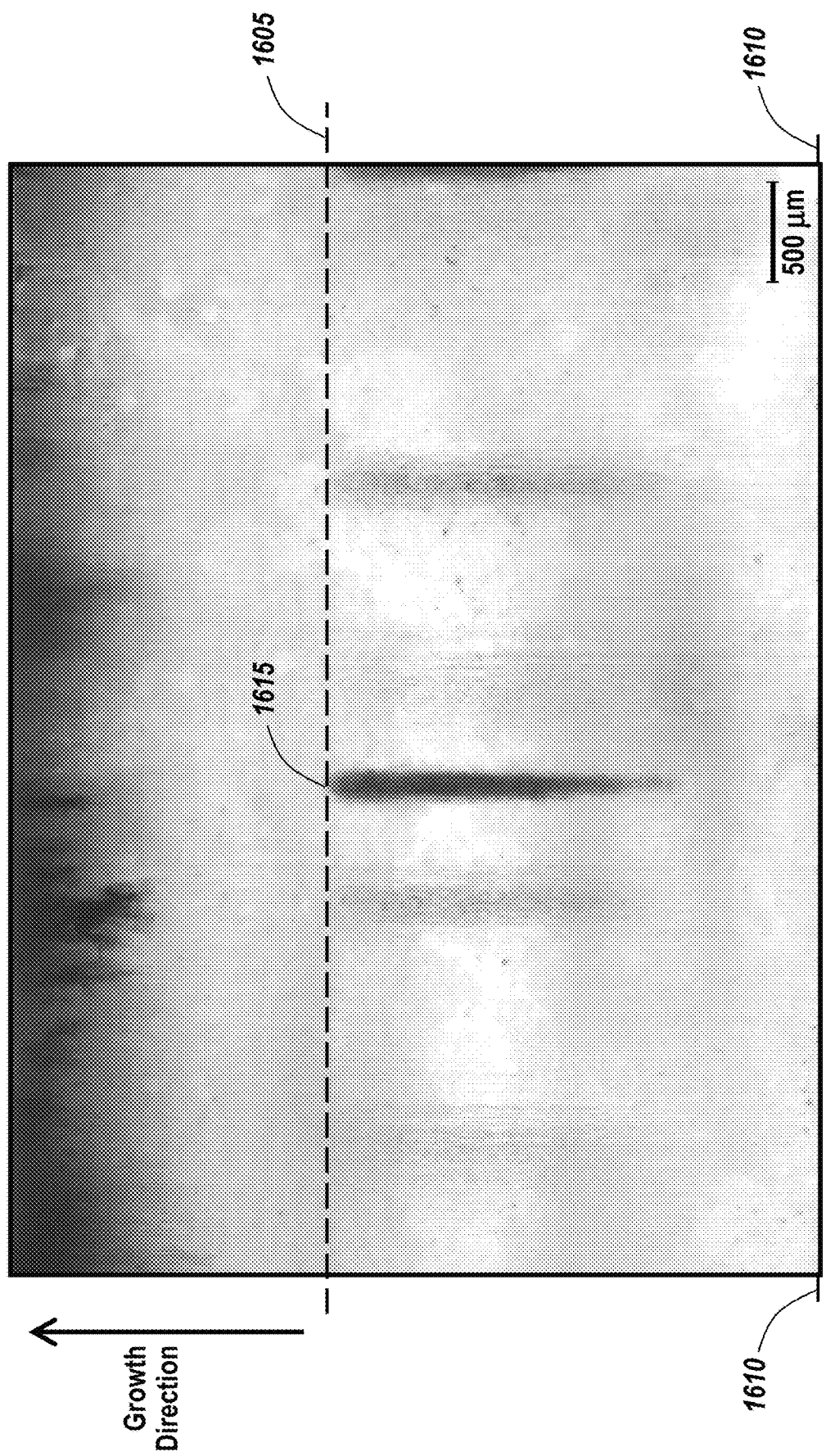

FIG. 16A is a micrograph of a side cross-section showing synthetic diamond growth after conditioning of an exterior surface of a substrate for an embodiment (embodiment A) in accordance with the present technology.

Figure 16B:
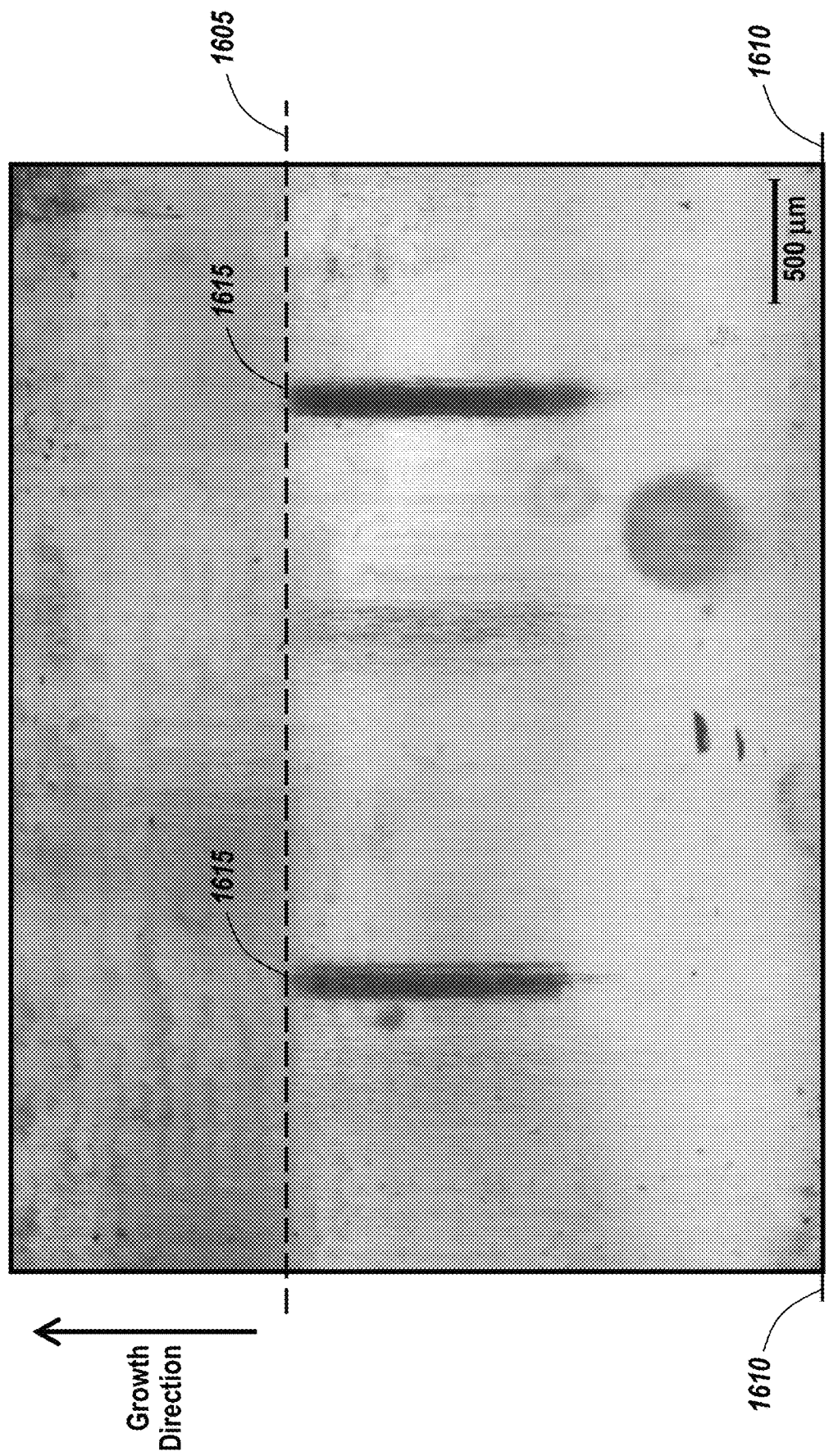

FIG. 16B is a micrograph of a side cross-section showing synthetic diamond growth after conditioning of an exterior surface of a substrate for an embodiment (embodiment B) in accordance with the present technology.

Figure 16C:
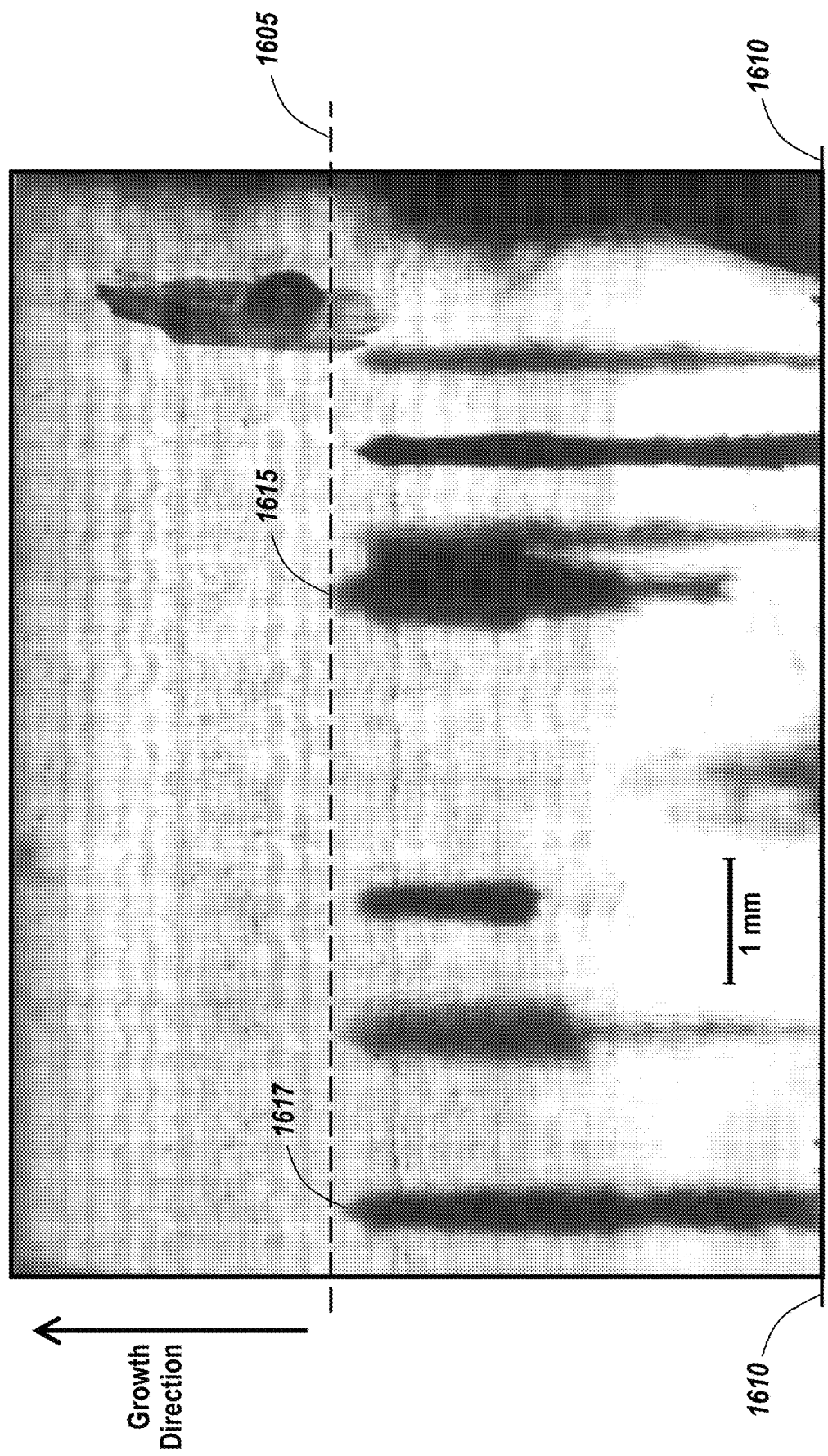

FIG. 16C is a micrograph of a side cross-section showing synthetic diamond growth after conditioning of an exterior surface of a substrate for an embodiment (embodiment C) in accordance with the present technology.

Figure 16D:
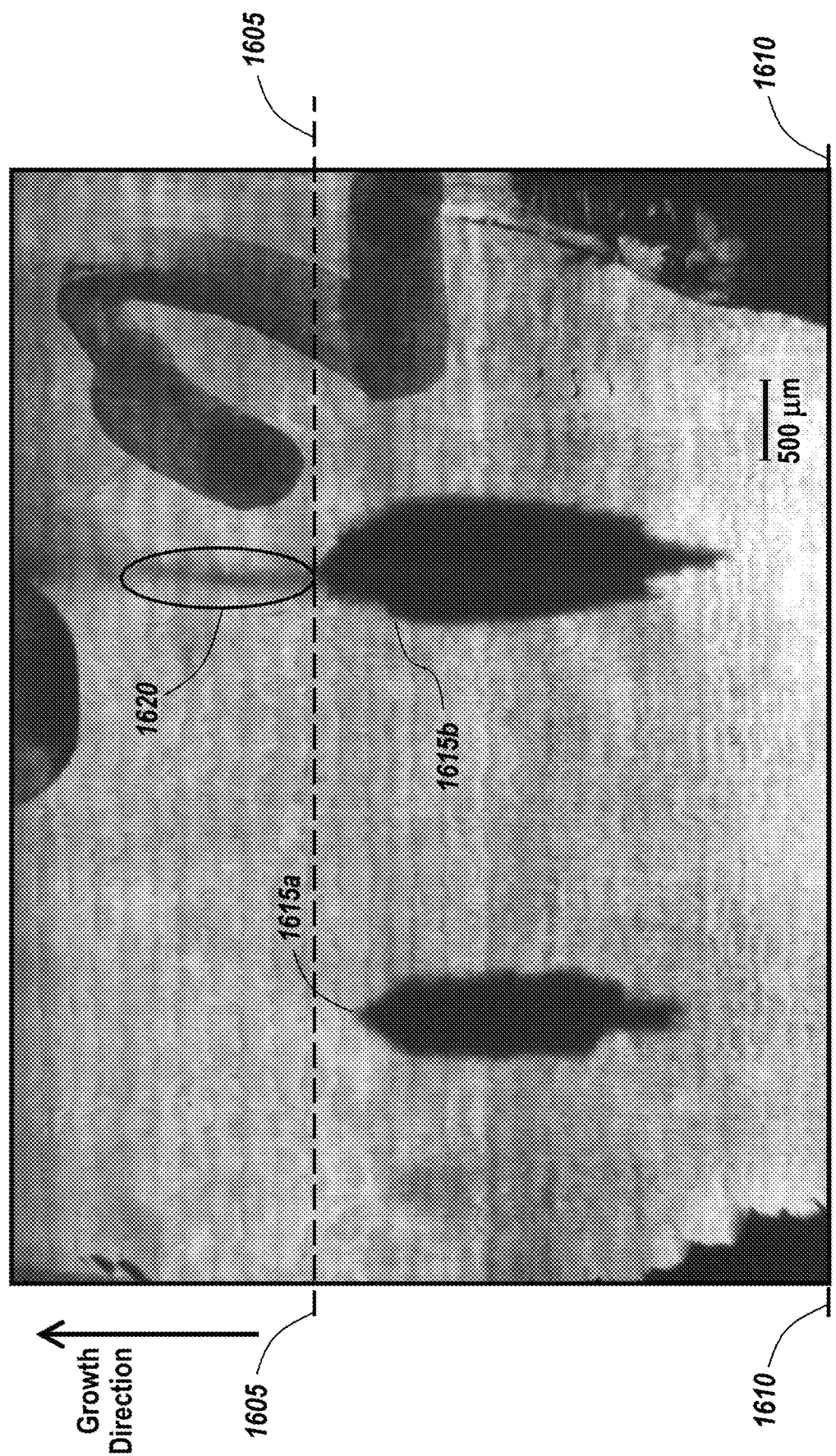

FIG. 16D is a micrograph of a side cross-section showing synthetic diamond growth after conditioning of an exterior surface of a substrate for an embodiment (embodiment D) in accordance with the present technology.

Figure 16E:
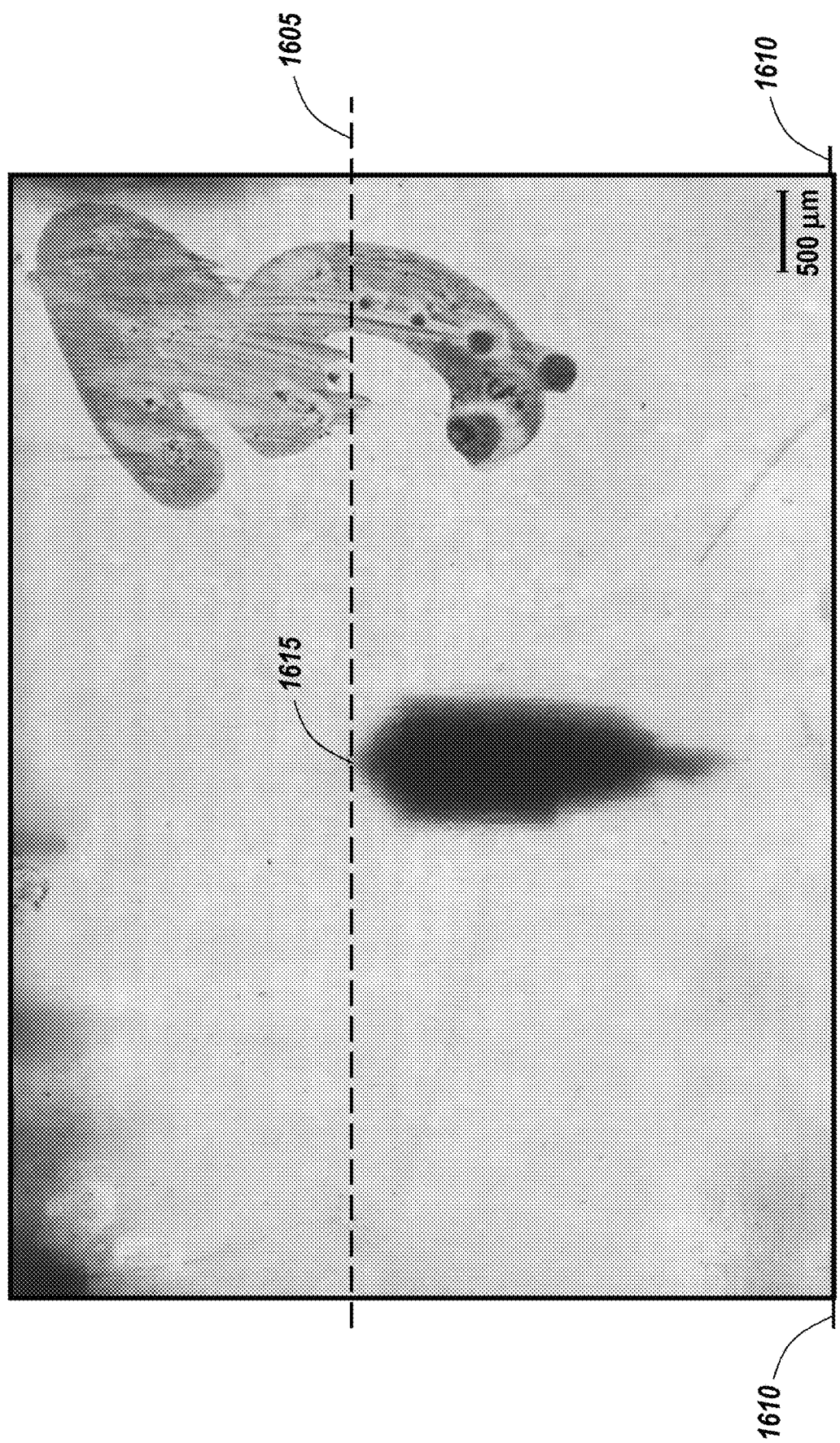

FIG. 16E is a micrograph of a side cross-section showing synthetic diamond growth after conditioning of an exterior surface of a substrate for an embodiment (embodiment E) in accordance with the present technology.

Figure 16F:
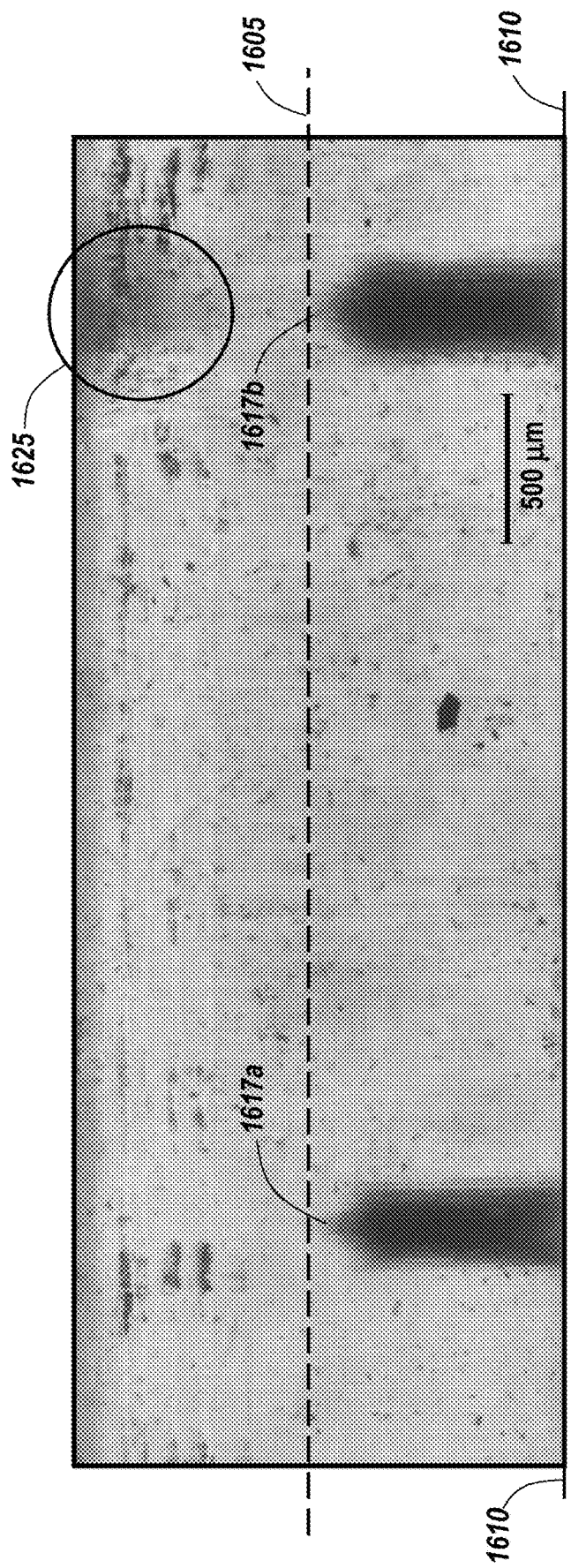

FIG. 16F is a micrograph of a side cross-section showing synthetic diamond growth after conditioning of an exterior surface of a substrate for an embodiment (embodiment F) in accordance with the present technology.

Figure 16G:
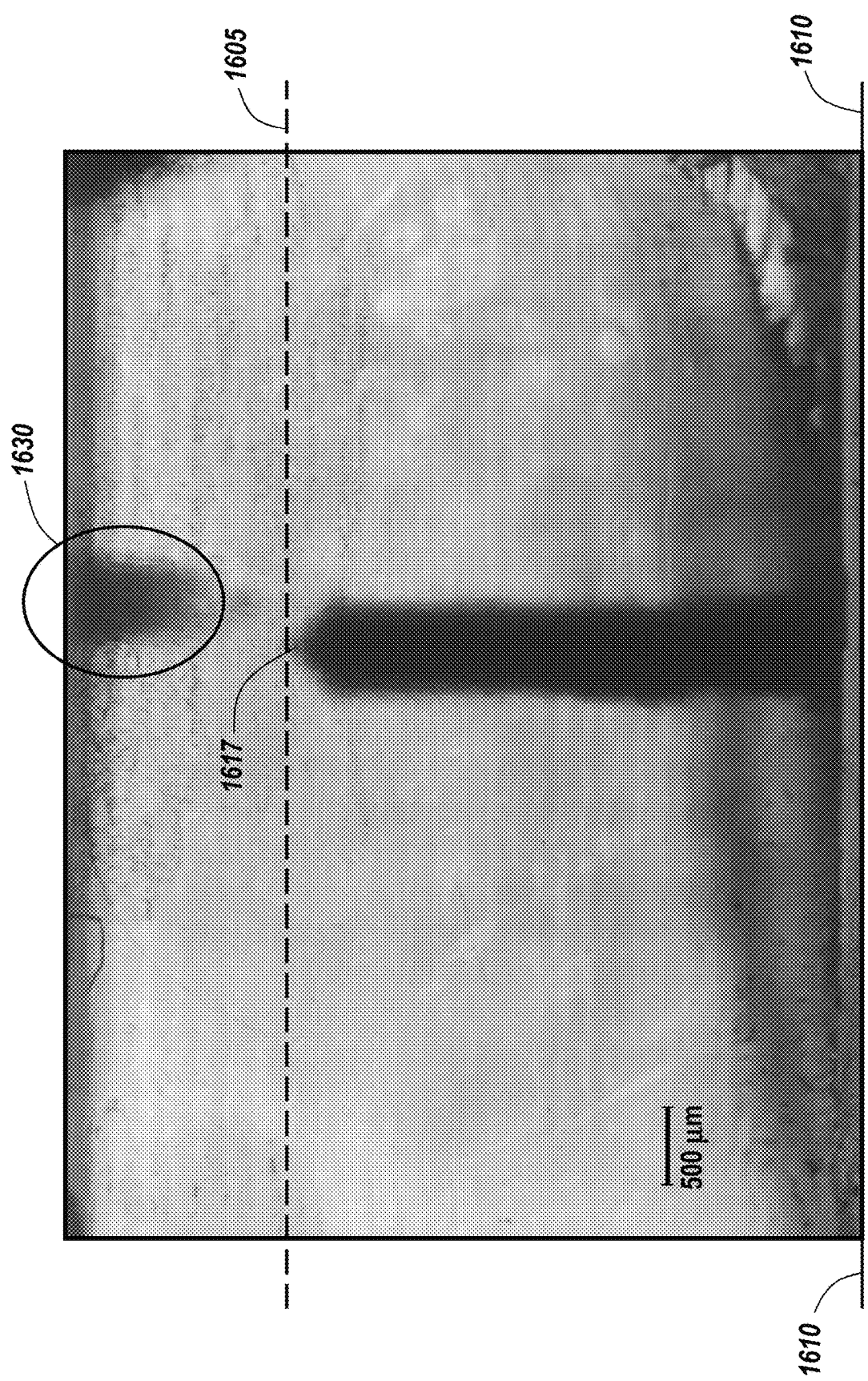

FIG. 16G is a micrograph of a side cross-section showing synthetic diamond growth after conditioning of an exterior surface of a substrate for an embodiment (embodiment G) in accordance with the present technology.

6. DESCRIPTION

Certain exemplary embodiments will now be described to provide an overall understanding of the principles of the structure, function, manufacture, and use of the devices and methods disclosed herein. One or more examples of these embodiments are illustrated in the accompanying drawings. Those skilled in the art will understand that the devices and methods specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present technology.

The present technology relates to a man-made diamond material and resulting diamond structures. In particular, the diamond material of the present technology includes a first phase consisting of a CVD grown SC diamond material that forms the matrix for a second phase diamond material. The second phase includes a plurality of diamond grains which are distinct from the first phase. Multiple Small Grain (MSG) diamond material includes both the first matrix phase and the second phase. That is, MSG diamond is a CVD grown multiphase material that includes a plurality of diamond grains within a single crystal diamond matrix.

Competition Between Sc Growth and Etch of MSG

The CVD process of growing synthetic MSG diamonds, can be characterized with respect to the time domain. The MSG diamond growth rate is higher than that of the SCD. Further, as the MSG diamonds growth progresses, its growth rate accelerates to the point that the entire surface is covered with MSGD and from that point on, the growth rate matches that of MSG diamonds and controlled by MSG diamond growth process conditions.

After the initial forming of multiple grain nucleation centers on the growth surface, there are two possible competing mechanisms available:
 1. Growth conditions that promote growth of MSG
 2. Etch conditions demoting the growth of MSG For example, the etch rate of MSG by monoatomic oxygen is significantly higher in temperature ranges of 900 C-1400 C.

Control over the ratio between SCD and MSG can be obtained using these two competing mechanisms. Moreover there is control over the encapsulation of the MSG in the single crystal by promoting the etch of the MSG.

The overall height of these regions can be controlled with a variety of parameters such as nitrogen concentration, etchant flow (e.g., oxygen etchant flow), pressure, exposure to the plasma heat (see definition) and localized temperature in the growth chamber. At the end of the process, the region's thickness is typically more uniform.

However, even if the region height is more uniform, it may contain multiple regions/areas of MSG diamond whose properties, such as fracture toughness and hardness, may vary locally. That is, different local areas within a region may have different properties.

This dynamic nature of the growth process enables the production of numerous hybrid diamond structures comprised of MSG diamond regions, faulted single crystal diamond layers and single crystal material. In some cases, the different sub-structures are connected and comprise a larger structure.

Faulted Single Crystal Diamond Phase

Figure 1A:
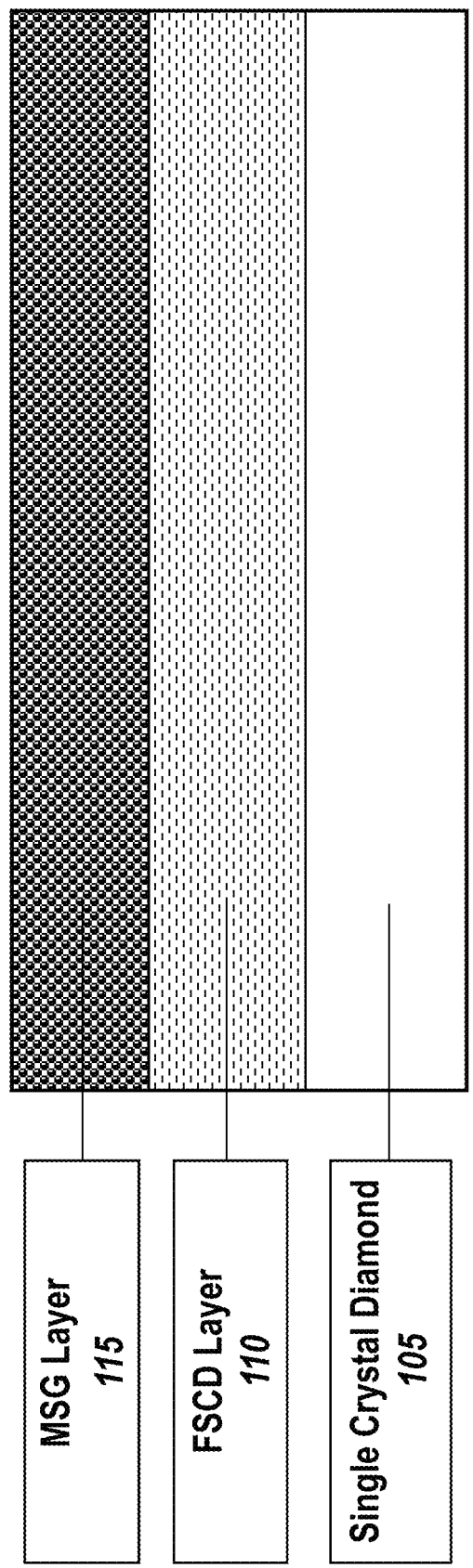
FIG. 1A is a schematic cross-sectional view of a man-made diamond material in accordance with an embodiment of the present technology.

Some embodiments include a faulted single crystal diamond layer. Referring to FIG. 1A, the layer adjacent to the MSG diamond region 115, and closer to the SC 105, is referred to as the Faulted Single Crystal Diamond (FSCD) layer 110. The FSCD layer is characterized by a high density of stacking faults, dislocations and grain boundaries. The FSCD layer is a CVD grown diamond layer that includes a high fault or stacking fault density. The FSCD layer thickness can be less than 1, 5, 10, 20, 50, 100, 200, 500, 750, 1000 microns. The FSCD layer area can be less than 1, 2, 5, 10, 25, 50, 75, 100% of the SC-MSG diamond surface contact area. The FSCD layer thickness can vary from less than 1, 2, 5, 10, 25, 50, 75 to 100% of max thickness.

Figure 1B:
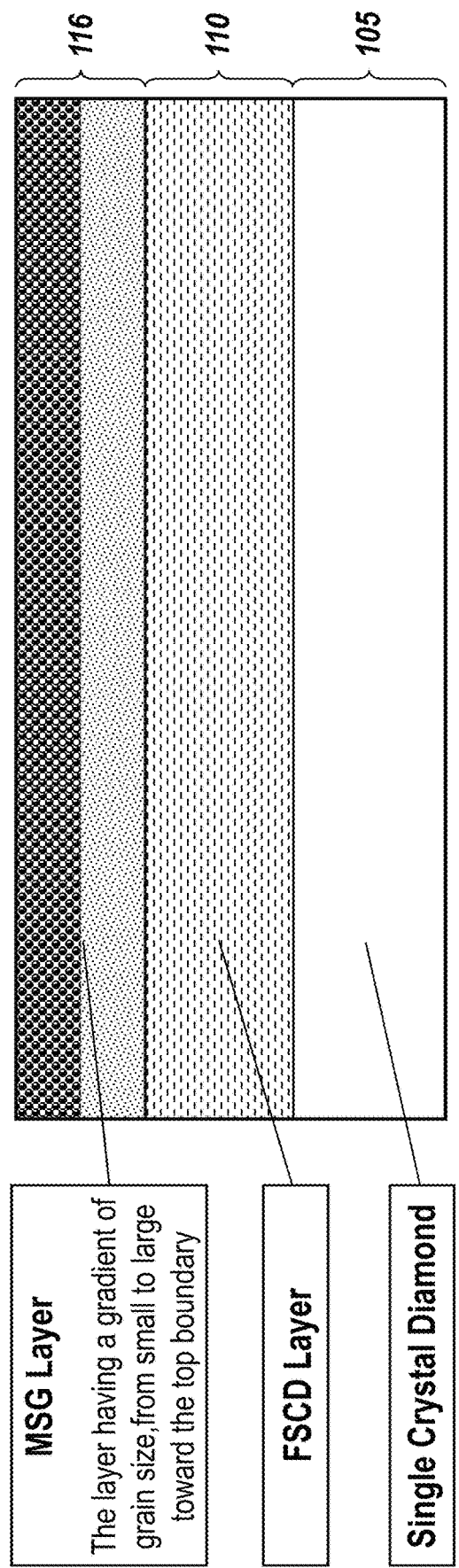
FIG. 1B is a schematic cross-sectional view of a man-made diamond material in accordance with another embodiment of the present technology.

The boundary between the FSCD 110 and that of the MSG diamond region 115 is defined by the size of the grains. The MSG diamond region 115 typically comprises grains larger than 30, 50, 75, 100, 200, 300 microns. And in some embodiments, such as the embodiment illustrated in FIG. 1B, the MSG diamond region 116 can include a gradient of grain size, from small to large towards a top boundary (i.e., opposite side from the boundary in contact with FSCD layer 110).

The FSCD properties are different than that of the SC and or of the MSG diamond regions (e.g., multiphase: SC/FSCD/MSG, 115 in FIG. 1A and 116 in FIG. 1B). For example, the FSCD's fracture toughness, hardness, and wear resist can be higher than that of the single crystal. Similarly, other properties such optical scattering, light polarization is higher than those of SCD.

Further, in the case of a SC that encapsulates a MSG diamond region (E-MSGD), there is a FSCD layer adjacent to the MSG diamond region. That is, a FSCD layer surrounds the MSG diamond region, and the combined structure is encapsulated within a SC. In such a structure, the FSCD layer characteristics, e.g. thickness, composition and fracture toughness, may vary as a function of its location. For example, the FSCD on the bottom of the MSG diamond, may be different then the FSCD on the sides and or upper portion of the MSG diamond. The bottom portion being the facet closest to the SC seed diamond and the upper portion being the later phase of diamond growth, toward the plasma region.

Laminate Structure Growth Process

The growth cycle of a laminate structure can be described schematically as follows, referring to FIG. 2:

A. Starts with a single crystal seed diamond (e.g., 105).

B. A defect is created or is formed or on the top surface of the diamond. The surface facing the plasma. Note that different types, shapes and or sizes of defects will develop into different types of MSG diamonds.

C. Growth of a MSGD region starts at the defect and expands in radially, in the lateral plane as well as upwards. Growth of the MSG diamond region (e.g., 115) is always preceded by a FSCD (e.g., 110). The thickness of the FSCD can be controlled via plasma and chamber parameters.

D. Since the growth rate of the MSG diamond region is typically faster than the growth rate of a SC, it can expand across the whole top surface of the SC.

By controlling the mode, location, size and orientation of the MSG diamond and or FSCD on or within a SC, one can customize a laminate SC & E-MSGD, or SC & FSCD & E-MSGD structure, to address the specifications of various applications.

Encapsulation Structures

FIG. 3 illustrates an embodiment of an encapsulated structure. In FIG. 3, multiple regions of MSG diamond material (i.e., MSG is a multiphase material including a single crystalline matrix and a plurality of diamond grains within the matrix) are encapsulated in a single crystal matrix 105. In the embodiment shown, a FSCD (high density fault region, 110) surrounds each region of MSG diamond material 115.

The encapsulated MSGD regions are not necessarily identical. There can be multiple modes/types of MSGD regions encapsulated within a single crystal matrix. The different modes may have different properties.

Encapsulated MSGD regions are typically considered undesirable and are removed during the diamond growth, with laser treatment and or etching processes.

However, in some cases, it is desirable to have a multiphased structure that has different properties in the different regions. Specifically, the SCD, FSCD and MSGD regions have different properties. Producing a diamond structure that has different properties in different regions may be beneficial. For example, with respect to:

Wear resist—MSGD and FSCD typically have higher wear resistance properties than SC.

Surface smoothness—SC phase typically has a smother surface than that of MSGD or FSCD.

Fracture toughness and hardness—E-MSGD and FSCD typically have higher fracture toughness and hardness.

Thermal and optical—SC phase has superior thermal and optical properties.

Electrical properties—SC has a higher uniformity of electrical properties than MSGD and FSCD.

By controlling the mode, location, size and orientation of the MSGD regions and or FSCD within a SC, one can customize a diamond structure, to address the specifications of various applications.

Encapsulation Structure Growth Process

The growth cycle of an encapsulated structure can be described schematically as follows with reference to FIG. 4:

A. Starts with a single crystal seed diamond, 105.

B. A defect is created or is formed or on the top surface of the diamond. The surface facing the plasma.

C. Growth of a MSG diamond region, 115 starts at the defect and expands in radially, in the lateral plane as well as upwards. Growth of the MSG diamond region is always preceded by a FSCD, 110. The thickness of the FSCD can be controlled via plasma and chamber parameters.

D. The plasma and chamber parameters are modified to accelerate the growth of a SC, 118 and retard the growth rate of the MSG diamond region. In this state the SC growth rate is faster than that of the MSG diamond region. Growth of the SC in the vicinity of the MSG diamond region is preceded by a FSCD, such that the encapsulated MSG diamond region is contained within a coating of FSCD and SC is formed around 118 and later above 120 the MSG diamond region, 115.

E. The encapsulation is completed when the SC connects above the MSG diamond region.

Encapsulation Growth Results

Growth of encapsulated diamond structures can be controlled by drilling holes or depressions in a single crystal substrate (e.g., purposely forming a defect) and then applying certain chamber conditions to the substrate. In most cases, the chamber conditions cause the hole to be filled with FSCD, MSG, additional FSCD and finally SC material, ultimately creating a completely encapsulated structure.

In general, any CVD chamber conditions that allow for synthetic diamond growth can be used in connection with the present technology. In particular, growth of diamond materials of the present technology has been practiced using a range of volumetric flow rate ratios of nitrogen to methane of 0.01 to 0.5. For example, a nitrogen to methane flow rate ratio of 0.01 can be used to create the diamond material of the present technology. In another embodiment a nitrogen to methane flow rate ratio 0.1 can be utilized. In a further embodiment, a nitrogen to methane flow rate ratio of 0.4 can be used. Further, the range of nitrogen to methane volumetric flow rate ratios is not so limited. For example, the ratio can be extended to 0.005 to 1.

In general, the growth temperature within the CVD chamber can be any temperature that allows for the creation of synthetic diamond. In certain embodiments, the growth temperature resides within a range of about 800 C to 1500 C. In some embodiments to the growth temperature is between about 900 C to 1300 C. And in certain embodiments the temperature is between 1100 C and 1400 C.

In general, the volumetric flow rates of the gases and growth temperatures applied to the CVD chamber are selected with a particular growth rate of resulting man-man diamond material in mind. In some embodiments, the selected or desired growth rate falls within a range of about 10 to 30 microns of growth per hour. In certain embodiments the desired growth rate is between about 12 to 26 microns per hour. In other embodiments, the desired growth rate range is between about 14 to 24 microns per hour.

To illustrate the results of methods of forming encapsulated structures, seven different single crystal diamond substrates were conditioned to provide one or more defects on an exterior growth surface. Defects were purposely created in these embodiments by laser drilling an exterior surface, although other methods of conditioning (e.g., etching, roughing, mechanically distressing, etc.) can be used. A laser drill was used to create a defect that was partial (i.e., hole did not extend through the entirety of the substrate) or full (i.e., through hole in the substrate extending from a top surface to a bottom surface). Different hole diameters and different growth conditions were applied. In all seven embodiments, CVD growth conditions to create encapsulated structures (i.e., capping region over, not just surrounding, structure formed in the hole) were applied.

Table 1 below summarizes the conditions of each of the seven embodiments, with resulting micrographs given as FIG. 16A, FIG. 16B, FIG. 16C, FIG. 16D, FIG. 16E, FIG. 16F and FIG. 16G.

FIG. 16A is a micrograph of the resulting structure of embodiment A. On the micrograph a dashed line 1605 has been added to indicate the approximate exterior top surface of the single crystal substrate. The approximate bottom surface of the substrate is indicated at location 1610. A hole was laser drilled at location 1615 that created a defect that did not extend through the substrate. That is the hole was a partial hole. After 93 hours of growth, synthetic diamond material filled the partial hole and created a capping region above dashed line 1605. The hole was filled with MSG, and the capping region was SC.

FIG. 16B is a micrograph of the resulting structure of embodiment B. On the micrograph dashed line 1605 has been added to indicate the approximate exterior top surface the single crystal substrate. The approximate bottom substrate surface is marked as 1610. FIG. 16B illustrates two drilled holes extending partially through the substrate (i.e., holes do not extend to bottom surface 1610). The holes were drilled at locations 1615. After 102 hours of CVD growth, MSG diamond material filled the holes followed by growth of SC capping region.

FIG. 16C is a micrograph of the resulting structure of embodiment C. On the micrograph dashed line 1605 has been added to indicate the approximate exterior top surface of the substrate. Line 1610 indicates the approximate location of the bottom surface of the substrate. A plurality of holes was drilled into the substrate. Some holes were partial holes, such as the hole at location 1615; whereas other holes extended through the substrate, such as the hole at location 1617. After 133 hours of CVD growth, MSG diamond material filled the holes and a SC capping region extended from the previously damaged exterior surface of the substrate.

FIG. 16D is a micrograph of the resulting structure of embodiment D. On the micrograph dashed line 1605 has been added to indicate the approximate exterior top surface of the substrate. Line 1610 indicates the approximate location of the bottom surface of the substrate. Two partial holes 1615a, 1615b were drilled into the substrate. After 145 hours of CVD growth, MSG diamond material filled the holes and a SC capping region extended from the previously damaged exterior surface of the substrate. It is noted that the capping region above location 1615a consists of only single crystalline diamond material; whereas above location 1615b, in a region marked 1620 a slope of MSG material is included within the capping region. That is, above the now filled defect at location 1615b, a small region of MSG growth has continued, preventing this area from being fully encapsulated.

FIG. 16E is a micrograph of the resulting structure of embodiment E. On the micrograph a dashed line 1605 has

TABLE 1

Encapsulation Growth Results (Corresponding to FIGS. 16A-16F)

| | Sample | | | | | | |
|---|---|---|---|---|---|---|---|
| | A | B | C | D | E | F | G |
| Start Height (mm) | 2.4 | 2.1 | 2.8 | 2.8 | 2.8 | 0.7 | 3.2 |
| End Height (after CVD growth) (mm) | 4.08 | 3.94 | 5.21 | 5.42 | 5.28 | 1.50 | 4.65 |
| Hole Diameter (microns) | 200 | 200 | 300 | 500 | 800 | 200 | 500 |
| Hole Depth (mm) | 1.7- partial drilling | 1.4- partial drilling | 2.0- partial drilling | 2.0- partial drilling | 2.0- partial drilling | 0.7- drilled through | 3.2- drilled through |
| Duration (hours) | 93 | 102 | 133 | 145 | 137 | 84 | 76 |
| SC Only Capping region Growth | Yes | Yes | Yes | Some, not all | Yes | Some, not all | Partial | been added to indicate the approximate exterior top surface of the single crystal substrate. The approximate bottom surface of the substrate is indicated at line 1610. A hole was laser drilled at location 1615 that created a defect that did not extend through the substrate. That is, the hole was a partial hole. After 137 hours of growth, synthetic diamond material filled the partial hole and created a capping region above dashed line 1605. The hole was filled with MSG, and the capping region was SC.

FIG. 16F is a micrograph of the resulting structure of embodiment F. On the micrograph dashed line 1605 has been added to indicate the approximate exterior top surface of the substrate. Line 1610 indicates the approximate location of the bottom surface of the substrate. Two through holes 1617a, 1617b were laser drilled through the substrate. After 84 hours of CVD growth, MSG diamond material filled the holes and a SC capping region extended from the previously damaged exterior surface of the substrate. It is noted that the capping region above location 1617a consists of only single crystalline diamond material; whereas above location 1617b, in a region marked 1625 a region of MSG material is included within the capping region. That is, above the now filled defect at location 1617b, a small region of MSG growth has continued, preventing this area from being fully encapsulated.

FIG. 16G is a micrograph of the resulting structure of embodiment G. On the micrograph, dashed line 1605 has been added to indicate the approximate exterior top surface of the substrate. Line 1610 indicates the approximate location of the bottom surface of the substrate. A through hole 1617 was laser drilled through the substrate. After 76 hours of CVD growth, MSG diamond material filled the hole and a SC capping region extended from the previously damaged exterior surface of the substrate. It is noted that the capping region above location 1617, in a region marked 1630, some MSG material is included within the capping region. That is, above the now filled defect at location 1617, a small region of MSG growth has continued, preventing this area from being fully encapsulated with SC material. However, this region 1630 appears to also have some SC grown material directly above the filled defect, e.g., directly above dashed line 1605, and then after some growth of SC capping material, MSG growth reappeared.

In embodiments A-G provided above, CVD conditions within the chamber were monitored and tailored during growth to cause the defect to be filled with FSCD, followed by MSG, and in some cases, transitioned back to FSCD, before forming a capping region. The capping region, in some embodiments was clean or pure single crystalline diamond material. In certain embodiments the capping region included some small regions of extended MSG growth above the location of the laser drilled defect.

Partial Encapsulation Structure

In an embodiment, a CVD grown diamond structure, wherein a single crystal diamond 117 partially encapsulates at least one diamond grain with different crystal orientation than that of the SC matrix, and or a MSG diamond region 115. A partial encapsulation is a structure in which the MSG diamond region 115 (and FSCD, 110) is surrounded by a SC, 117, but not completely. For example, when the encapsulation growth process is halted when the MSG diamond region is surrounded by a SC, 117 on the sides and has not yet formed and or connected above the MSG diamond region. In other words, the SC is on at least two surface of the MSG diamond portion, radially—lateral to the growth plane. See FIG. 5 illustrating a cross-sectional view and a perspective view of partial encapsulation.

Further, from the phase in which a MSG diamond region is surrounded by a SC on the sides, the plasma and chamber parameters can be modified such that the growth rate of the SC and that of the MSG diamond region is approximately equal. In this state the SC the MSG diamond region and FSCD will be visible from the top view, and the depth of the MSG diamond region will increase. By controlling and balancing the etching chemistry, the SC growth rate can be slowed down and the MSG diamond region growth rate can be slowed at a greater degree. That is, the MSG diamond region growth rate will be slower than the SC growth rate which has been slowed down.

Multiple Small Grain Modes/Types

In the case of growing a MSG diamond region, the process starts with a single crystal diamond seed, with defects that exist or are created on its top surface. The surface that is facing the plasma. Different types of defects, e.g. a local hot spot, scratch, a pit, drill hole, or a crack, may develop into different types of MSG diamond regions. In addition, different types of defects, e.g. a local hot spot, scratch, a pit, drill hole, or a crack, with different growth conditions may develop into different types of MSG diamond region.

We will refer to four types of MSGDs, which are shown schematically in FIG. 6

A. An island—an island is primarily cone or pyramid shaped. From a top view an island looks primarily circular or square and bounded. See, for example, FIG. 7C outlining regions of SC, 705, FSCD, 710, and MSG 715 diamond material. In a cross section it resembles a triangle, whose base is on the top surface and its apex, or origin, is at the original defect from which it grew. See FIG. 7A illustrating an encapsulated island in cross section. See also FIG. 7B illustrating a partially encapsulated island (no capping region) in cross section. See also FIGS. 8, 9A and 9B, which are SEM micrographs illustrating the tip or apex of island growth. The original defect may be on the top surface of the original SC seed, or on a SC layer or region that grew from the SC seed (e.g., a FSCD layer). In addition, CVD conditions can be altered to promote MSG growth without the need for a defect.

The dimensions of an island's top diameter, its major diameter, D-island, is less than 10, 100, 500, 1,000, 2,500, 5000, 10,000 micrometers. Its height, H-island (not shown) is less than 10, 100, 500, 1,000, 2,500, 5000, 10,000 micrometers.

B. A conglomerate—is composed of multiple small islands or partially spherical shaped volumes. From a top view a conglomerate looks like a multiple grains, close together. In a cross section, each of the partially spherical shaped volumes resembles a partial grain, triangle or mushroom, with a short stem.

The dimensions of a conglomerate's single sphere top diameter, its major diameter, d-cong., is less than 10, 20, 50, 100, 500, 1,000, 2,500, 5000, 10,000, 20,000, 30,000 micrometers. Its height, H-cong. (not shown), is less than 10, 20, 50, 100, 500, 1,000, 2,500, 5000, 10,000, 20,000, 30,000 micrometers. The dimensions of a conglomerate's multi sphere top diameter, D-cong., is 100, 500, 1,000, 2,500, 5000, 10,000, 20,000, 30,000 micrometers.

C. A plane—is composed primarily of MSG diamond region structures that form a wall of hybrid MSG/SC/FSCD structures, resembling a randomly perforated vertical piece of paper. From a top view each plane looks primarily rectangular, whose length is much larger than its width. Multiple planes intersect or contact one another. In a cross section, each of the planes looks primarily triangular or rectangular. (See FIG. 6, row C, plane. See also FIG. 10).

The length of a plane's single rectangular element, L-plane, is less than 10, 20, 50, 100, 500, 1,000, 2,500, 5000, 10,000, 20,000, 30,000 micrometers. The width of a plane's single rectangular element, W-plane, is less than 2, 5, 10, 20, 50, 100, 500, 1,000 micrometers. Its height H-plane (not shown) is less than 2, 5, 10, 20, 50, 100, 500, 1,000, 2,500, 5000, 10,000, 20,000, 30,000 micrometers. The dimensions of a plane's multi element top major diameter, D-plane is 50, 100, 500, 1,000, 2,500, 5000, 10,000 micrometers.

D. A vein—is composed of primarily narrow MSG diamond region structures, resembling a rope. From a top view each vein looks primarily like a non-linear line (e.g., pathway), whose length, L, is much larger than its width, w. Multiple veins intersect or contact one another. In a cross section, each of the veins look like a line, whose length is much larger than its width. (See FIG. 6, row D).

The length of a vein's single linear element L-vein, is less than 2, 5, 10, 20, 50, 100, 500, 1,000, 2,500, 5000, 10,000, 2,500, 5000, 10,000, 20,000, 30,000 micrometers. The width of a vein's single linear element, W-vein, is less than 2, 5, 10, 20, 50, 100, 500, 1,000 micrometers. Its height, H-vein (not shown) is less than 2, 5, 10, 20, 50, 100, 500, 1,000, 2,500, 5,000, 10,000, 20,000, 30,000 micrometers. The dimensions of a vein's multi element top major diameter, D-vein, is 50, 100, 500, 1,000, 2,500, 5000, 10,000 micrometers.

Both plane and vein types are formed when there is a high density of faults. In particular scattered grains develop, typically after some period of FSCD growth (see FIG. 11, side view). Vein structure occurs when the scattered grains grow along a pathway. When the scattered grains grown along a linear pathway, plane structure develops.

In an embodiment, there is a plurality of MSGD regions, consisting of multiple MSGD types that will form and grow open to on the growth surface or encapsulated within and covered by the SCD. In general, the MSGD types can be categorized as forming from island type or forming from scattered type. MSGD forming from island type includes both fully encapsulated and partially encapsulated island. These islands are formed, in some embodiments from a small FSCD layer, which is typically no greater in thickness than 100 microns, and is generally no more than 10 microns in thickness. In certain embodiments, the islands are formed under CVD conditions that promote MSG and no traceable FSCD layer is needed. In the scattered category, MSGD includes scattered grains, vein, and plane configurations. In general, the scattered category of MSGD is formed from a relatively thick FSCD layer, typically in the range of 1000 to 5000 microns. In some instances the thick FSCD layer leading to scattered type can be as little as 500 microns. In general, each of scattered, vein and plane type MSGD includes a matrix a single crystal matrix and the two phases (e.g., first phase singe crystal matrix and the second phase MSGD consisting of plane type) grow on the growth surface forming a laminated structure.

Flow Conditions for forming an exemplary encapsulated island, an exemplary partially encapsulated island and an exemplary plane/scattered are provided in the Tables 2-4 given below:

TABLE 2

Flow 1
Encapsulated Island

| Step | Name | Condition |
|---|---|---|
| 1 | starting material | single crystal |
| 2 | surface conditioning | std |
| 3 | Growth | single crystal |
| 4 | Mask | MSG center of growth MASK |
| 5 | Etch | MSG center of growth O2 Etch |
| 6 | Mask removal | ASH |
| 7 | Growth | MSG growth conditions |
| 8 | Growth | MSG growth elimination-high etchant flow |
| 9 | Growth | single crystal |
| 10 | Shaping | std |
| 11 | seed cut off | std |

TABLE 3

Flow 2
Surface Island

| Step | Name | Condition |
|---|---|---|
| 1 | starting material | single crystal |
| 2 | surface conditioning | std |
| 3 | growth | single crystal |
| 4 | Mask | MSG center of growth MASK |
| 5 | Etch | MSG center of growth O2 Etch |
| 6 | Mask removal | ASH |
| 7 | growth | MSG growth conditions |
| 8 | growth | MSG growth elimination |
| 9 | shaping | std |
| 10 | seed cut off | std |

TABLE 4

Flow 3
Plane/Scattered

| Step | Name | Condition |
|---|---|---|
| 1 | starting material | Plane type MSG seed |
| 2 | surface conditioning | std |
| 3 | growth | MSG Plane growth conditions |
| 4 | shaping | std |
| 5 | seed cut off | std |

EXAMPLES

The following Examples illustrate some of the potential applications of the diamond materials grown/manufactured in accordance with the present technology. The examples illustrate some of the possible tailoring capabilities of the material. The examples are by no means exhaustive or limiting.

Example 1. Diamond Tool with a Through Hole

In an embodiment, a functional tool, with a through hole, is made of a SCD and or of MSGD regions and or of a 'Hybrid Structure of CVD grown single crystal diamonds with encapsulated MSG diamond region'.

The functional tool may be disk shaped, in which its major dimension, in a top view, is larger than its thickness. The major dimension may be a diameter if the disk is circular, (see FIG. 12 A) or primary diameter if the disk is oval, or diagonal if the disk is rectangular, square or triangle shaped.

The functional tool may be tubular shaped, in which its major dimension, in a top view, is smaller than its height.

The through hole is typically through the disk thickness or through the tube height. (See FIG. 12 B). In an embodiment, the through hole axis is in the center of the disk or tube. In an embodiment the hole is cylindrical throughout or partial. In an embodiment, the hole is conical throughout or partial. In an embodiment, the hole has at least two sections. In an embodiment, instead of a hole there is notch which has an opening to the surface. In an embodiment the notch is of uniform shape throughout its length. In an embodiment the notch is shape is not uniform throughout its length. In an embodiment the notch length is the length of a through hole. In an embodiment the notch length is less than the length of a through hole.

In an embodiment, the functional tool is composed of more than one layer/region. For example, of 3 layers: a SC layer on the bottom, followed by a FSCD and a MSGD layer or region at the top. See, for example, FIG. 12 C.

In one embodiment, a tool (not shown) cut out of a SC that encapsulated MSGD regions, such that there are 5 layers: a SC layer on the bottom, followed by a FSCD, a MSGD layer followed by another FSCD and a SC at the top.

In an embodiment, a layer is composed of a MSGD regions encapsulated within SC structure. In an embodiment, the MSGD regions are distributed within the layer (see FIG. 12. D).

in random distribution;
in a uniform concentration;
in different concentrations at different regions of the layer;
in specific locations in the layer, e.g. along one of the layer facets, in proximity of the hole; as well as
partially exposed at the layer boundary.

Example 2. Wire Drawing Die

In an embodiment, a wire drawing die is made of a resulting diamond structure including CVD grown single crystal diamonds with encapsulated MSGD regions.

A typical wire drawing die has multiple segments along it through hole. See, for example, FIG. 13 which shows: entrance portion, exit portion and a wire passing portion including a reduction, bearing and back relief. The different segments may have specific functionalities that may require different surface and or bulk properties.

For example, consider FIG. 13. Most of the wire deformation occurs in the entrance and reduction segments while wire smoothing occurs in the bearing and back relief segments. In an embodiment, the entrance and reduction segments have a significant amount of MSGD exposed on the surface of the through hole. The other segments are primarily SCD with a minimal amount of MSGD on the surface of the hole. See. FIG. 14.

In an embodiment, the density of the MSGDs in the entrance and reduction segments varies. In an embodiment there is a gradient from high density, at the top of the entrance segment, the larger diameter of the hole, to lower density in the reduction segment, toward the bearing segment.

In an embodiment, there is a FSCD layer in between two segments (i.e., between the reduction segment and the bearing segment).

In an embodiment, the segments differ only in the vicinity of the hole. That is, the bulk of the jewel is made of SCD. In the vicinity of the hole the different segments have different structures. In the vicinity implies less than 1, 2, 5, 10, 25, 50, 100, 250, 500, 1000, 2000, 5000, microns inside the bulk. Inside the bulk is typically radially, from the hole axis, towards the circumference.

For example, the entrance segment may have a layer of MSGD #1, of 100 microns thickness, the reduction segment may have a layer of MSGD #2, of 20 microns thickness and in between the reduction and bearing segment there may be a 2 microns thick FSCD layer, 20 microns long.

Example 3. Water Cutting Jet Jewel

In an embodiment, a water jet jewel is made of a 'Hybrid Structure of CVD grown single crystal diamonds with encapsulated MSGD regions.

The water jet jewel is created so that it has multiple segments along it through hole. The different segments may have specific functionalities that may require different surface and or bulk properties.

Referring to FIGS. 15A-E, most of the abrasion occurs in the entrance segments as a result of water at high speed applying local force to the jewel therefore eventually eroding it in mechanisms that start with a difference in the material and continue with a local failure of the material. In this case, the wear resistance can be improved by adding a layer of encapsulated MSGD. FIGS. 15A-15E illustrate various, conventional entrance segments. In an embodiment, encapsulated MSG diamond material is added as a layer to water exposed surfaces of the entrance segments.

Another example is the damage that occurs as a result of drifting of abrasive particles by side currents towards the jewel. The damage revealed in the exit side of the jewel is explained by the side current that is created when the main high speed jet current leaves the jewel. The side current brings the particles to the exit of the jewel and small portion of them are expedited towards the jewel material creating erosion in the form of pits in the jewel material.

In an embodiment, the entrance segments have a significant amount of MSGD exposed on the surface of the through hole. The other segments are primarily SCD with a minimal amount of MSGD on the surface of the hole.

Example 4. Material Removal Segment

Material removal structures typically deploy very hard material grains or elements, within a binder material. During the material removal process, the hard material grains or elements erode and or disconnect from the binder. Both phenomena are important to maintain a sharp and effective material removal tool. Various applications and material removal process have different requirements that create different specifications for hard material grains and the binders, however the rule of thumb is that the binder and abrasive should be matched to the removed target material. For relatively soft target, hard material grains with a higher hardness and wear resistance that erode slower is preferred. For hard target material, softer binder with hard abrasive is preferred. A robust binder system that will support the hard material grains for a longer duration is preferable.

In common material removal systems, the material removal hard material is sometimes a mass of one type abrasive, other times for a more complex target material an element comprised of multiple materials. Sometimes the material removal hard material is a structure comprising a core, a shell and may be additional layers.

In common material removal systems, the hard material grains are adhered to a matrix or binder. In some cases, the material removal hard material grains are imbedded within a matrix or binder. In some cases, the binder or matrix is adhered to a support system such as a backing. For purposes of this discussion, the material encapsulation or supporting the hard material grains will be referred to as an encapsulating single crystal diamond or ESCD.

Example 5. Improved Wear Characteristics

To investigate the wear resistance of diamond materials made in accordance with the present technology the following experiments and measurements were conducted. A cast iron polishing surface was prepared with a surface coating of 5 to 10 microns synthetic resin bond diamond powder and diluted with contact adhesive. Three separate diamond samples were prepared. The first was stone #40201, which was positioned with respect to the polishing surface with the 100 face towards the polishing surface and contained MSGD. The second, was stone #40202 which was positioned with the 110 face towards the polishing surface and had no MSGD present. The third sample was stone #40203, which also had no MSGD present but was positioned with 100 face towards the polishing surface.

It is commonly known to persons having ordinary skill in the art that polishing of diamond stones has a higher wear rate on the 110 face than all other faces. On the other hand, the 100 face tends to be extremely difficult to cut or wear.

The three samples were weighed, separately and together with polishing holders (e.g., collets and sleeves). All weight information was recorded. The loaded collets with diamond samples were inserted into diamond tangs. The tangs were then weighed at the polishing end and the weights were adjusted to be equal at 675 grams each. The diamond samples were then placed on the stationary polishing pad at 150 mm from the center and the motor was turned on to a set speed of 3500 RPMs. The polishing pad was set for 60 minutes. At the expiration time, the motor was turned off and the collets and sleeves containing the diamond samples were then removed from the tangs, weighed and the weights recorded. The process was then repeated for two more cycles of 60 minutes each.

The test results are show below in Table 5:

TABLE 5

| | Orientation and characteristics | | |
| --- | --- | --- | --- |
| | 100 with MSGD | 110 SC (no MSGD) | 100 SC (no MSGD) |
| Stone # | 40201 | 40202 | 40203 |
| Block weigh (g) | 0.560 | 0.610 | 0.580 |
| Collet and Sleeve weight (g) | 34.126 | 34.328 | 34.288 |
| Combined weight (g) | 34.686 | 34.938 | 34.868 |
| Combined weight after 60 minutes (g) | 34.685 | 34.741 | 34.864 |
| Combined weight after 120 minutes (g) | 34.681 | 34.470 | 34.701 |
| Finished weight after 180 minutes (g) | 0.556 | 0.070 | 0.252 |
| Weight Loss (g) | 0.004 | 0.540 | 0.328 |

The structure described herein addresses many of the prior art short comings. The resulting diamond material, in which the SCD is the system matrix is unique. The SC by itself is extremely hard with high wear resistance properties. The supported MSGD within it have much higher hardness, fracture toughness and wear resistance than ordinary small grain diamonds. In the resulting diamond materials and structures described herein the MSGD are an integral part of the SC, in that they are grown together.

Another advantage of the present technology is the lack of a backing layer (e.g., a foreign or different material substrate layer). In the present technology a substrate formed of SC diamond is utilized. As a result, a multiphase diamond material is formed without including a second material, such as, for example, a steel disc substrate as used in electroplating diamond growth techniques. Therefore, one of the advantages of the present technology is the ability to create diamond structures or primarily diamond structures that do not contain or rely upon different types of materials (e.g., steel).

The structure in which the MSGD are imbedded within the SC further creates a higher wear resistant structure in that the MSGD disconnect only upon application of significant forces that will create cracks in the supporting ESCD. Further, abrasion resistance and impact resistance are known to be directly proportional to the size of the hard material grain elements. As the size of the hard material grain elements decreases, the abrasion resistance increases. However, as the size of the hard material grain elements decreases in prior art systems, so does the complexity of securing them within a robust binder. In the structure described herein, the task of securing the MSGDs to the ESCD is created by the growth of the ESCD and MSGD together using CVD, hence the system design consideration can be based solely on the required abrasion resistance.

An addition advantage of the diamond materials and structures described herein is similar thermal coefficients. That is, different portions of the structure (e.g. SC versus MSG) have similar, or nearly identical, coefficient of thermal expansion. As a result, components, systems and devices made from the resulting diamond material can be operated at higher temperatures without concern for degradation due to a mismatch of thermal expansion coefficients between the hard material grains and the binder (encapsulation material). The system can also be operated at higher pressures without concern for degradation.

What is claimed is:

1. A method of tailoring a diamond material structure, the method comprising:
    positioning a single crystal diamond substrate in a CVD reactor;
    conditioning the single crystal diamond substrate to include one or more defects on an exterior growth surface, wherein each of the one or more defects is defined by a surface that has a different lattice orientation than the single crystal diamond substrate;
    setting CVD reactor conditions to a first setting to promote growth of one of (i) single crystalline diamond material or (ii) multiphase material comprising a first phase including a plurality of diamond grains which are distinct from the single crystal diamond substrate and a second phase forming a matrix for the first phase and consisting of single crystal diamond having the same lattice orientation as the single crystal diamond substrate; and
    after CVD growth at the first setting, altering CVD reactor conditions to a second setting different than the first setting to promote growth of the other of (i) single crystalline diamond material or (ii) multiphase material comprising a first phase including a plurality of diamond grains which are distinct from the single crystal diamond substrate and a second phase forming a matrix for the first phase and consisting of single crystal diamond having the same lattice orientation as the single crystal diamond substrate.

2. A method of tailoring a diamond material structure, the method comprising:
   positioning a single crystal diamond substrate in a CVD reactor;
   conditioning the single crystal diamond substrate to include a CVD diamond layer including a high fault density on exterior growth surface;
   setting CVD reactor conditions to a first setting to promote growth of one of (i) single crystalline diamond material or (ii) multiphase material comprising a first phase including a plurality of diamond grains which are distinct from the single crystal diamond substrate and a second phase forming a matrix for the first phase and consisting of single crystal diamond having the same lattice orientation as the single crystal diamond substrate; and
   after CVD growth at the first setting, altering CVD reactor conditions to a second setting different than the first setting to promote growth of the other of (i) single crystalline diamond material or (ii) multiphase material comprising a first phase including a plurality of diamond grains which are distinct from the single crystal diamond substrate and a second phase forming a matrix for the first phase and consisting of single crystal diamond having the same lattice orientation as the single crystal diamond substrate.

3. The method of tailoring according to claim 1, further comprising adjusting the CVD reactor conditions between the first and second settings to tailor the resulting diamond material structure.

4. The method of tailoring according to claim 1, further comprising setting CVD reactor conditions to a third setting to promote growth of both of (i) the single crystalline diamond material and (ii) the multiphase material.

5. The method of tailoring according to claim 1, further comprising:
   positioning a masking structure in relation to an exterior growth surface of the single crystal diamond substrate before altering CVD reactor conditions to the second setting.

6. A method of manufacturing a diamond material, the method comprising:
   positioning a single crystalline diamond substrate in a CVD reactor;
   conditioning the single crystalline diamond substrate to include one or more defects on an exterior growth surface, wherein each of the one or more defects is defined by a surface that has a different lattice orientation than the single crystal diamond substrate;
   operating the CVD reactor at a first set of conditions that promotes growth of a multiphase material comprising a first phase including a plurality of diamond grains, each of the plurality of diamond grains being crystallographically distinct from the single crystalline diamond substrate and a second phase forming a matrix for the first phase, the second phase consisting of CVD grown single crystalline diamond, to result in nucleation of one or more islands comprising multiphase material at locations of the one or more defects;
   operating the CVD reactor at a second set of conditions that promote growth of CVD single crystalline material over growth of the multiphase material; and
   operating the CVD reactor at a third set of conditions that promote growth of a capping region on the one or more islands.

7. The method of claim 6, wherein conditioning the single crystal diamond substrate to include one or more defects on the exterior growth surface comprises laser drilling one or more holes on the exterior growth surface.

8. The method of claim 6, wherein the third set of conditions form a capping region consisting of single crystalline material.

9. The method of claim 6, wherein the third set of conditions form a capping region including regions of first phase diamond material.

10. The method of tailoring according to claim 2, further comprising adjusting the CVD reactor conditions between the first and second settings to tailor the resulting diamond material structure.

11. The method of tailoring according to claim 2, further comprising setting CVD reactor conditions to a third setting to promote growth of both of (i) the single crystalline diamond material and (ii) the multiphase material.

12. The method of tailoring according to claim 2, further comprising:
   positioning a masking structure in relation to an exterior growth surface of the single crystal diamond substrate before altering CVD reactor conditions to the second setting.

* * * * *